(12) United States Patent
Mizue et al.

(10) Patent No.: US 10,553,688 B2
(45) Date of Patent: Feb. 4, 2020

(54) SEMICONDUCTOR DEVICE HAVING FIELD PLATE

(71) Applicants: SUMITOMO ELECTRIC INDUSTRIES, LTD., Osaka (JP); SUMITOMO ELECTRIC DEVICE INNOVATIONS, INC., Kanagawa (JP)

(72) Inventors: Chihoko Mizue, Yokohama (JP); Tomohiro Yoshida, Osaka (JP)

(73) Assignees: SUMITOMO ELECTRIC INDUSTRIES, LTD., Osaka (JP); SUMITOMO ELECTRIC DEVICE INNOVATIONS, INC., Kanagawa (JP)

(*) Notice: Subject to any disclaimer, the term of this patent is extended or adjusted under 35 U.S.C. 154(b) by 0 days.

(21) Appl. No.: 16/213,559

(22) Filed: Dec. 7, 2018

(65) Prior Publication Data

US 2019/0181232 A1 Jun. 13, 2019

(30) Foreign Application Priority Data

Dec. 7, 2017 (JP) ................................. 2017-235389

(51) Int. Cl.
| | |
|---|---|
| H01L 29/76 | (2006.01) |
| H01L 29/40 | (2006.01) |
| H01L 29/417 | (2006.01) |
| H01L 29/78 | (2006.01) |
| H01L 29/66 | (2006.01) |
| H01L 29/778 | (2006.01) |
| H01L 29/20 | (2006.01) |

(52) U.S. Cl.
CPC ...... *H01L 29/402* (2013.01); *H01L 29/41725* (2013.01); *H01L 29/66462* (2013.01); *H01L 29/7786* (2013.01); *H01L 29/78* (2013.01); *H01L 29/2003* (2013.01)

(58) Field of Classification Search
CPC .................... H01L 29/41725; H01L 29/66462
See application file for complete search history.

(56) References Cited

U.S. PATENT DOCUMENTS

| | | | |
|---|---|---|---|
| 2008/0272443 A1 | 11/2008 | Hoshi et al. | |
| 2012/0012858 A1* | 1/2012 | Inoue | .................... H01L 21/765 257/76 |

FOREIGN PATENT DOCUMENTS

JP 2008-277604 11/2008

* cited by examiner

*Primary Examiner* — Samuel A Gebremariam
(74) *Attorney, Agent, or Firm* — Smith, Gambrell & Russell, LLP.

(57) ABSTRACT

A transistor type of field effect transistor (FET) having a field plate is disclosed. The FET provides an active region and two inactive regions sandwiching the active region therebetween, where the electrodes are provided in the active region. The FET further includes fingers and buses of the drain and the source. The fingers overlap with the electrodes of the drain and the source; while the busses are provided in respective inactive regions. The field plate includes a field plate finger and a field plate interconnection. The field plate finger extends parallel to the gate electrode in a side facing the drain electrode. The field plate interconnection connects the field plate finger with the source interconnection in the inactive region opposite to the inactive region where the drain bus exists.

8 Claims, 27 Drawing Sheets

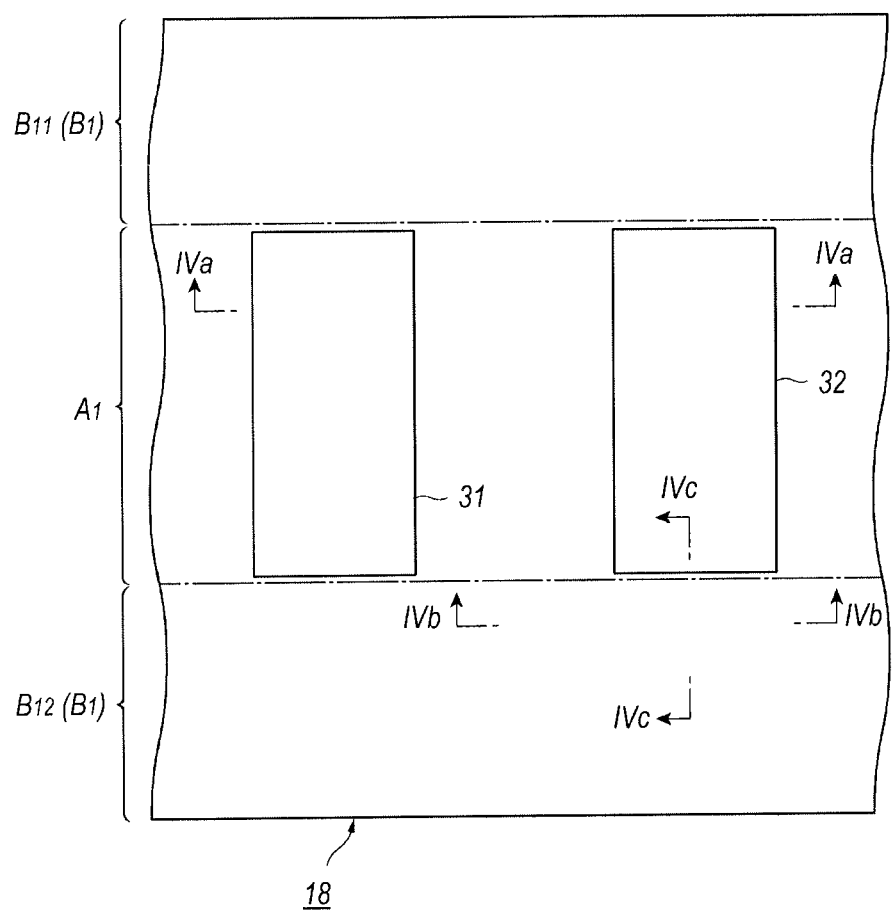

SEMICONDUCTOR DEVICE HAVING FIELD PLATE

CROSS REFERENCE TO RELATED APPLICATIONS

The present application is based on and claims the benefit of priority of Japanese Patent Application No. 2017-235389, filed on Dec. 7, 2017, the entire content of which is incorporated herein by reference.

BACKGROUND OF INVENTION

1. Field of the Inventions

The present invention relates to a semiconductor device, in particular, the invention relates to a semiconductor device primarily made of nitride semiconductor materials.

2. Background Arts

A Japanese Patent Application laid open No. JP2008-277604A has disclosed a field effect transistor made of nitride semiconductor materials and having, what is called, a field plate. In a field effect transistor (FET) having an active layer epitaxially grown on a substrate, the active layer not contributing the FET operation is inactivated by, for instance, implanting ions therein to destroy crystal quality. Thus, the ion-implantation may divide the active layer into an active region and an inactive region surrounding the active region. The active region provides electrodes of a source, a drain, and a gate of an FET, while, the inactive region provides interconnections and pads for the electrodes of the source, the drain, and the gate, where the source pad, the source interconnection, the gate pad, and the gate interconnection are disposed in one side with respect to the active region, while, the drain pad and the drain interconnection are arranged in another side opposite to the one side.

An FET primarily made of nitride semiconductor materials sometimes provides a field plate on an insulating film that covers the gate electrode to moderate field strength induced at an edge of the gate electrode. The field plate may suppress temporal reduction of a drain current, which occurs just after a recovery from a hard turning-off condition and generally called as current collapsing. The field plate may also shield the gate electrode from the drain electrode, because the field plate is generally grounded, or connected with the source electrode that is grounded. An additional interconnection, which may called as a field plate interconnection, may physically connect the field plate with the source electrode. The field plate interconnection generally detours around the gate electrode in order to intersect the gate electrode, which means that the field plate interconnection runs closer to the drain interconnection, namely, between the gate electrode and the drain interconnection, where the prior patent document above listed has disclosed such an arrangement of the field plate interconnection. Thus, the field plate interconnection running closer to the drain interconnection increases parasitic capacitance of the drain interconnection.

SUMMARY OF INVENTION

An aspect of the present invention relates to a transistor type of field effect transistor (FET) that provides a drain electrode, a source electrode, and a gate electrode. The transistor of the invention includes a semiconductor stack, a drain interconnection, a source interconnection, and a field plate. The semiconductor stack has an active region and inactive regions that sandwich the active region therebetween, where the active region provides the drain electrode, the source electrode, and the gate electrode therein. The drain interconnection includes a drain pad and a drain finger, where the drain pad is disposed in one of the inactive regions, while, the drain finger extends substantially parallel to the gate electrode and overlaps with the drain electrode. The source interconnection includes a source pad and a source finger, where the source pad is disposed in another of the inactive regions, while, the source finger extends substantially parallel to the gate electrode and overlaps with the source electrode. The field plate includes a field plate finger and a field plate interconnection, where the field plate finger extends substantially parallel to the gate electrode in an area between the gate electrode and the drain electrode, and partially overlaps with the gate electrode, while, the field plate interconnection is provided in another of the inactive regions and connects the field plate finger with the source interconnection.

BRIEF DESCRIPTION OF THE DRAWINGS

These and other aspects of the invention may be understood by reference to the following detailed description, taken in conjunction with the accompanying drawings, wherein:

FIG. 3 is a plan view of the transistor shown in FIG. 1 at a step of a process of forming the transistor;

DESCRIPTION OF EMBODIMENT

Next, some embodiments according to the present invention will be described referring to accompanying drawings. The present invention, however, is not restricted to those embodiments and has a scope defined in claims attached and includes all modifications and changes of elements in the claims and equivalent thereto. Also, in the description of the drawings, numerals and/or symbols same with or similar to each other will refer to elements same with or similar to each other without duplicating explanations.

Figure 1:
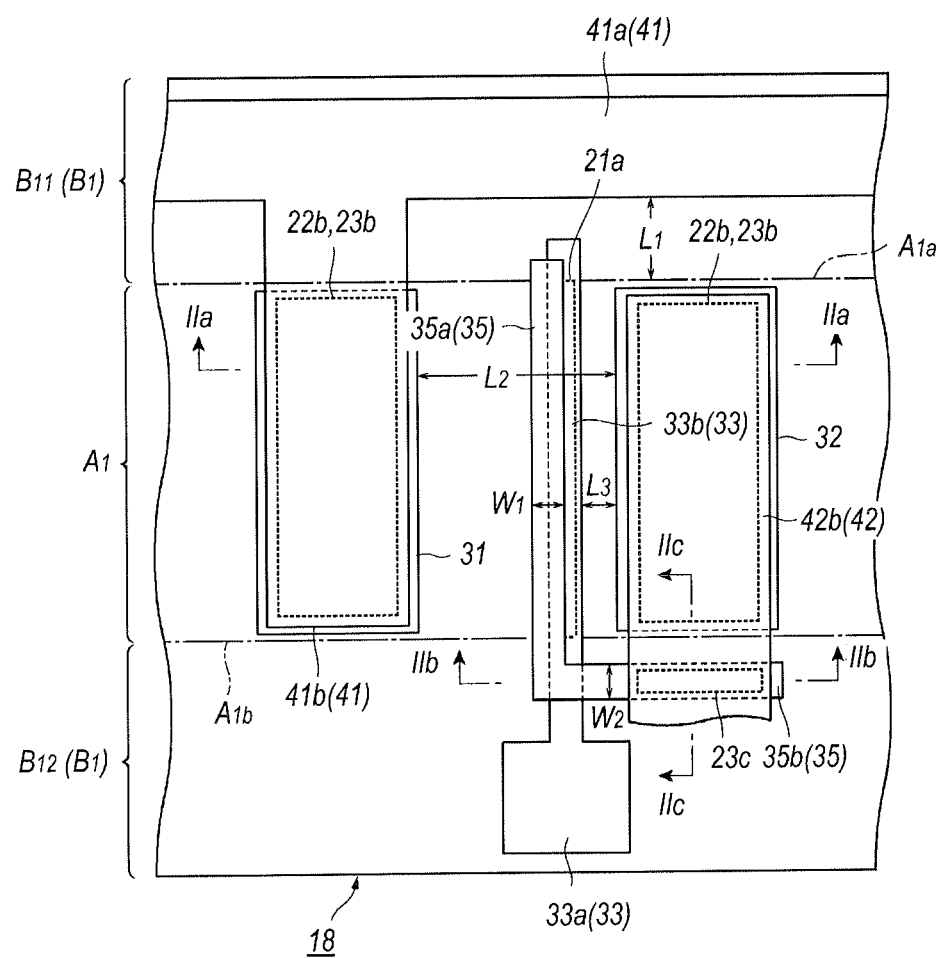
FIG. 1 is a plan view showing a transistor according to an embodiment of the present invention.
Figure 2A:
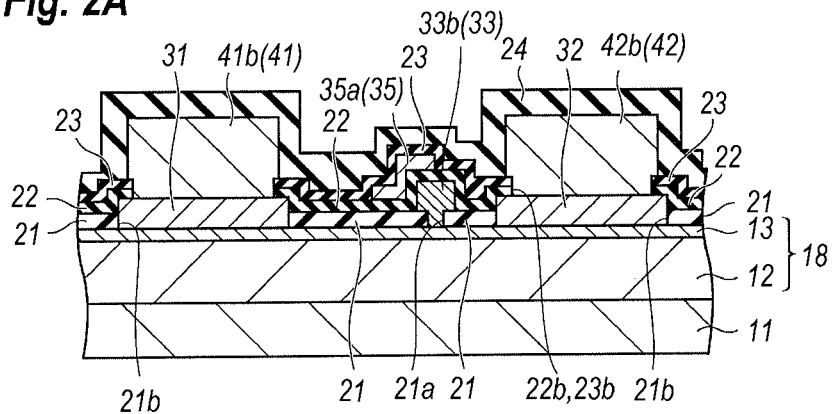
FIG. 2A to FIG. 2C are cross sectional views of the transistor shown in FIG. 1, where those cross sectional views are taken along lines, IIa-IIa, IIb-IIb-, and IIc-IIc, indicated in FIG. 1, respectively.
Figure 2B:
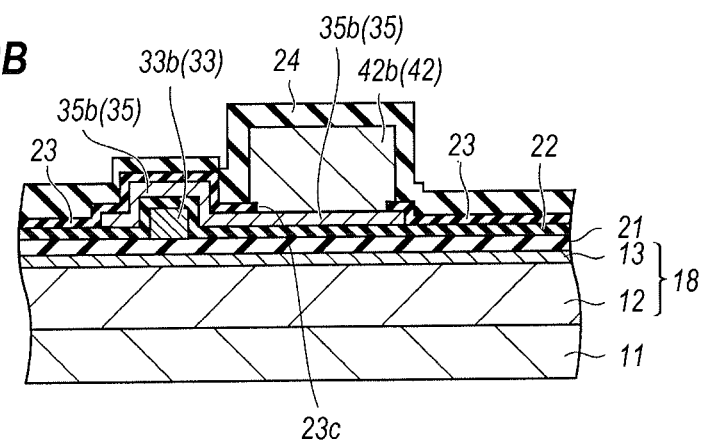
Figure 2C:
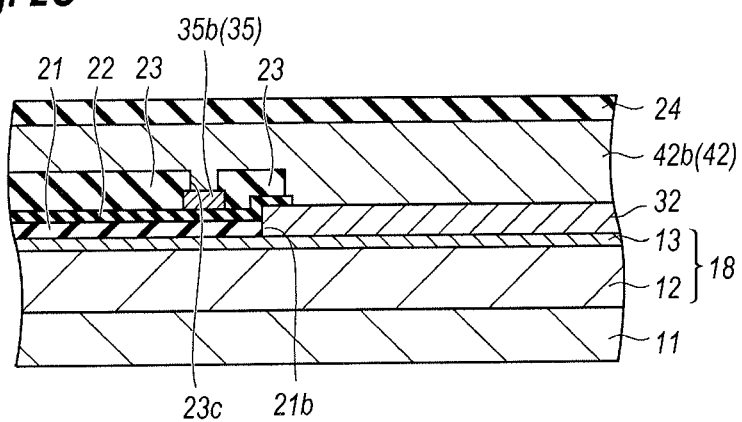
Figure 4A:
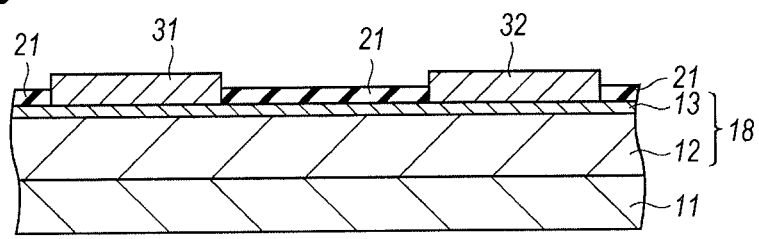
FIG. 4A to FIG. 4C are cross sectional views of the transistor at the step of the process, where the cross sectional views are taken along lines, IVa-IVa, IVb-IVb, and IVc-IVc, respectively, each indicated in FIG. 3.
Figure 4B:
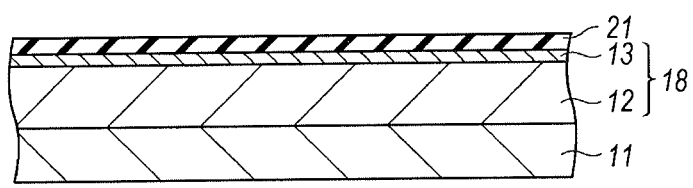
Figure 4C:
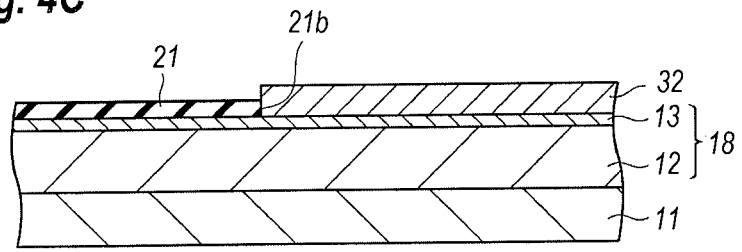
Figure 5:
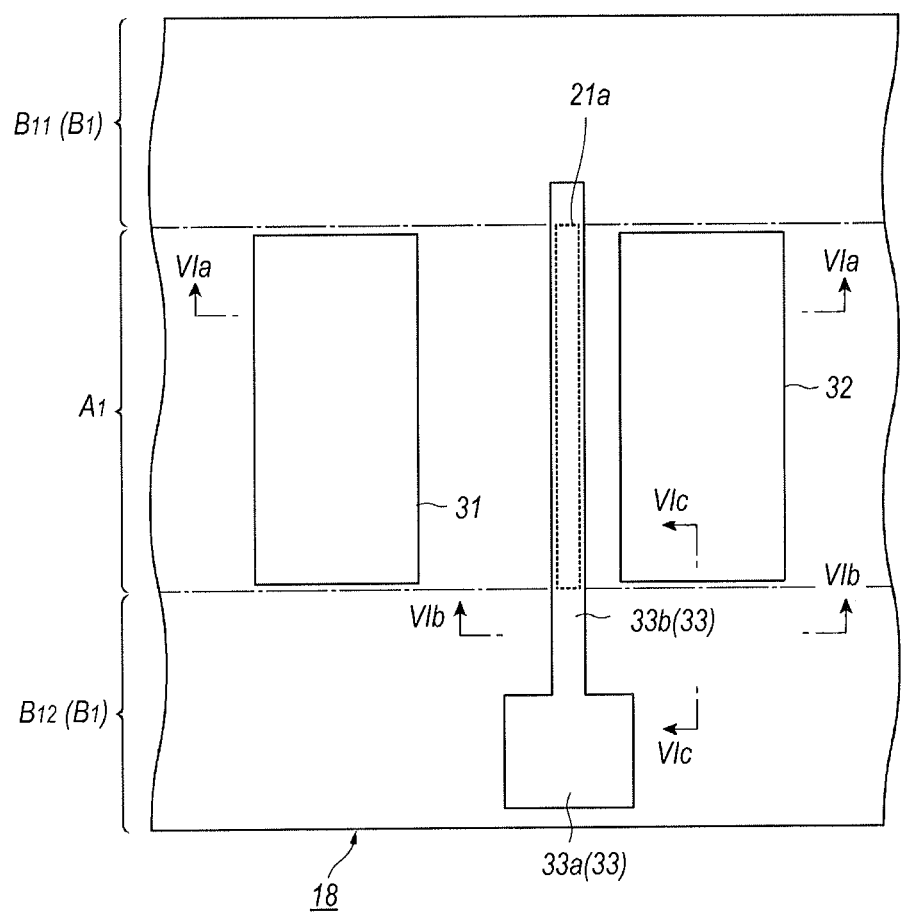
FIG. 5 is a plan view of the transistor at a step of the process subsequent to that shown in FIG. 3.

FIG. 1 is a plan view of a transistor 1A type of field effect transistor (FET) according to an embodiment of the present invention, and FIG. 2A to FIG. 2C are cross sectional views of the transistor 1A taken along lines IIa-IIa, IIb-IIb, and IIc-IIc indicated in FIG. 1, respectively.

The transistor 1A of the present embodiment includes a substrate 11 and a semiconductor stack 18 provided on the substrate 11, where the semiconductor stack 18 includes semiconductor layers primarily made of nitride semiconductor materials. The transistor 1A also provides electrodes of a drain 31, a source 32, and a gate 33 on the semiconductor stack 18. The substrate 11, which is prepared for epitaxially growing nitride semiconductor layers thereon, may be made of silicon (Si), silicon carbide (SiC), sapphire ($Al_2O_3$), diamond (C) and so on. The substrate 11 has a thickness of, for instance, around 500 µm.

The transistor 1A of the present embodiment has a type of high electron mobility transistor (HEMT) including a channel layer 12 and a barrier layer 13 in the semiconductor stack 18, where the channel layer 12 and the barrier layer 13 induce a two-dimensional electron gas (2DEG) in the channel layer 12 at an interface against the barrier layer 13. The channel layer 12, which is epitaxially grown on the substrate 11, may be made of gallium nitride (GaN) with a thickness of 0.5 to 1.0 µm, where the transistor 1A of the embodiment has a thickness of 1.0 µm for the channel layer 12. The barrier layer 13, which is epitaxially grown on the channel layer 12, may be made of aluminum gallium nitride (AlGaN), indium aluminum nitride (InAlN), or indium aluminum gallium nitride (InAlGaN) each having a thickness of 10 to 30 nm, where the barrier layer 13 of the embodiment is made of $Al_{0.25}Ga_{0.75}N$ with a thickness around 20 nm. The barrier layer 13 may show n-type conduction. The semiconductor stack 18 of the present embodiment exposes the barrier layer 13, that is, the semiconductor stack 18 in a top thereof has the barrier layer 13; however, the semiconductor stack 18 may further include a cap layer on the barrier layer 13, where the cap layer may be made of GaN, or n-type GaN, with a thickness of 5 nm.

The semiconductor stack 18, as shown in FIG. 1, provides an active region A1 and an inactive region B1, where the former region A1 is operable as a transistor, while the latter region B1, which is formed by implanting heavy ions, for instance, argon ions ($Ar^+$), surrounds or sandwiches the former region A1 and electrically isolates the active region A1 from peripheries. The inactive region B1 includes first and second inactive regions, B11 and B12, sandwiching the active region A1 therebetween. That is, the first inactive region B11 exists outside of an edge A1a of the active region A1; while, the second inactive region B12 extends outside of another edge A1b of the active region A1 opposite to the former edge A1a.

The electrodes of the drain 31 and the source 32 are provided on and in contact with the semiconductor stack 18 in the active region A1. The electrodes of the drain 31 and the source 32 extend along a direction connecting the edges, A1a and A1b, of the active region A1. That is, the drain electrode 31 and the source electrode 32 have respective rectangular shapes with longitudinal sides extending perpendicular to the edge, A1a and A1b. The drain electrode 31 and the source electrode 32, which are, what is called, an ohmic electrode showing a non-rectifying characteristic against the semiconductor stack 18, may be formed by alloying stacked metals of titanium (Ti) with a thickness around 10 nm and aluminum (Al) with a thickness around 200 nm. The stacked metals for the ohmic electrode may further include another Ti with a thickness around 10 nm on Al. The stacked metals may substitute Ti to tantalum (Ta) with a thickness same with Ti.

The electrodes of the drain 31 and the source 32 are in contact with the barrier layer 13, or with the cap layer provided on the barrier layer 13. In an alternative, those electrodes, 31 and 32, may be formed on the channel layer 12 by partially removing the barrier layer 13, or partially removing the barrier layer 13 and the channel layer 12.

The transistor 1A may further provide a drain interconnection 41 that connects the drain electrodes 31 in respective transistor elements and is connected with an external device, where the transistor element includes one gate electrode and electrodes of the drain 31 and the source 32 sandwiching the one gate electrode. The drain interconnection 41 may include a drain bus 41a and a drain finger 41b, where the drain bus 41a extends along a lateral direction of the drain electrode 31; namely, substantially perpendicular to the drain electrode 31, in the first inactive region B11, while the drain finger 41b extends along the longitudinal direction of the drain electrode 31 and covers or overlaps with the drain electrode 31. The drain interconnection 41 may be formed by plating gold (Au) by a thickness of about 5 µm.

Figure 11:
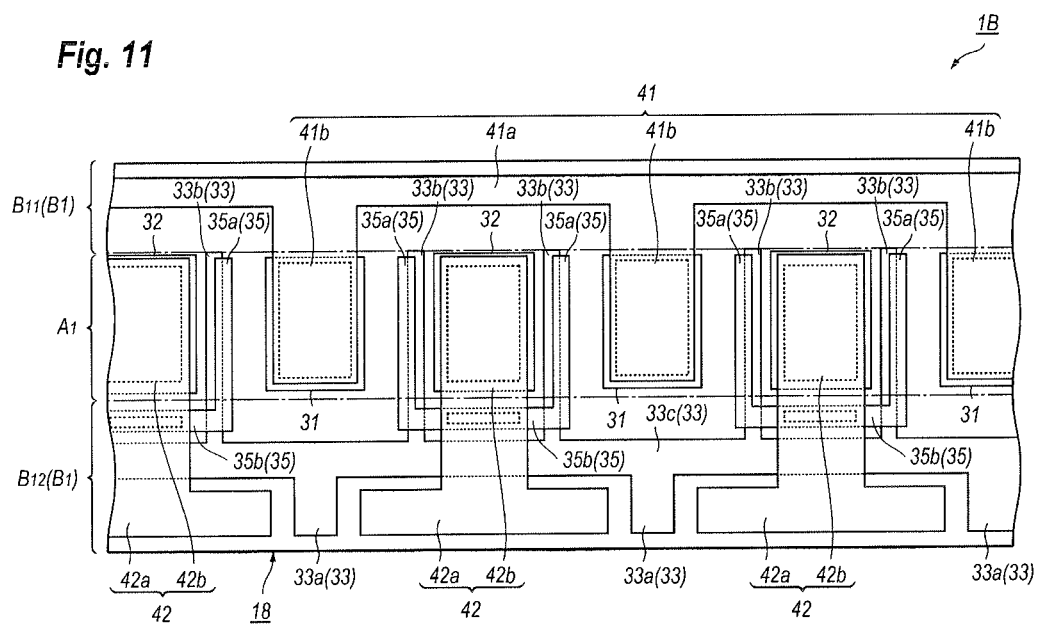
FIG. 11 is a plan view of a transistor according to the first modification of the transistor shown in FIG. 1.

The transistor 1A may further provide a source interconnection 42 that connects source electrodes 31 in respective transistor elements. Referring to FIG. 11, the source interconnection 42 includes a source bus, which is not illustrated in FIG. 1, and a source finger 42b, where the source bus is provided in the second inactive region B12 and extends along the edge A1b of the active region A1; while, the source finger 42b extends along the longitudinal direction of the source electrode 32 and covers or overlaps with the source electrode 32. The source interconnection 42 may be formed by plating gold (Au) by a thickness of about 5 µm.

The gate electrode 33, which is provided between the drain electrode 31 and the source electrode 32 in the active region A1, may be made of stacked metals of nickel (Ni), palladium (Pd), and gold (Au) with thicknesses of 100 nm, 50 nm, and 500 nm, respectively. In an alternative, the gate electrode 33 may be stacked metals of Ni, platinum (Pt), and gold (Au) with thicknesses of 20 nm, 20 nm, and 600 nm, respectively. The Ni is in contact with the semiconductor stack 18 to form a Schottky contact against the semiconductor stack 18. The gate electrode 33 may have a total thickness greater than 300 nm taking uniformity in the thicknesses of the respective metals into account; while, preferably thinner than 700 nm from a viewpoint of coverage of the gate electrode 33 by the insulating film 22.

Referring to FIG. 1, the gate electrodes 33 may include a gate pad 33a and a gate finger 33b, where the gate pad 33a is provided in the second inactive region B12 and extends along the edge A1b of the active region A1; while, the gate finger 33b extends perpendicular to the edge A1b.

The transistor 1A further provides insulating films, 21 to 24, and a field plate 35. The insulating films, 21 to 24, appearing in FIG. 2A to FIG. 2C may protect the semiconductor stack 18, the electrodes of the drain 31, the source, 32, and the gate 33, and the field plate 35 not only mechanically but chemically, and electrically isolate between the electrodes, 31 to 33, and the field plate 35.

The insulating film 21, which is the first insulating film, is in contact with and covers at least a portion of the semiconductor stack 18 exposed from the electrodes, 31 to 33. Specifically, the insulating film 21 provides three (3) openings, 21a and 21b, through which the electrodes, 31 to 33, are in contact with the semiconductor stack 18, where FIG. 1 omits the openings 21b for the electrodes of the drain 31 and the source 32. The opening 21a filled with the gate electrode 33 has a width of 0.4 µm that corresponds to the gate length of the transistor 1A. The insulating film 21 may be made of silicon nitride (SiN) with a thickness around 60 nm.

The second insulating film 22, which is provided on the first insulating film 21, covers the electrodes, 31 to 33. The second insulating film 22 also provides openings 22b that expose the drain electrode 31 through which the drain finger 41b in the drain interconnection 41 is in contact with the drain electrode 31. The second insulating film 22 also provides another opening 21b overlapping with the source electrode 32 through which the source finger 42b of the source interconnection 42 is in contact with the source electrode 32. The openings, 22b and 23b, have areas narrower than the respective electrodes, 31 and 32. The second insulating film 22 may be also made of silicon nitride (SiN) with a thickness of 0.1 to 1.0 µm, where the embodiment provides the second insulating film 22 with a thickness of 0.1 µm.

The third insulating film 23, which is provided on the second insulating film 22, covers the field plate 35 that is provided on the second insulating film 22; accordingly, the third insulating film 23 may prevent the field plate 35 from causing short-circuits against the drain interconnection 41 and the source interconnection 42. The third insulating film 23 provides openings 23b whose sizes are substantially equal to the openings 22b in the second insulating film 22, where the drain finger 41b and the source finger 42b are in contact with the electrodes, 31 and 32, through vertically overlapping two openings, 22b and 23b. The third insulating film 23 also prevents the field plate 35 from oxidization. The third insulating film 23 may be also made of silicon nitride (SiN) with a thickness of 0.1 µm. The fourth insulating film 24 covers the drain interconnection 41 and the source interconnection 42.

The field plate 35, which is provided on the second insulating film 22, is an electrically conductive element, for instance, may have stacked metals of nickel (Ni) and gold (Au) from the side of the second insulating film 22. The nickel (Ni) maybe substituted to titanium (Ti). The field plate 35 provides a field plate finger 35a extending along the gate electrode in an area between the drain electrode 31 and the gate electrode 33, while, a field plate interconnection 35b in the second inactive region B12. The field plate finger partially overlaps with the gate electrode 33, exactly, the gate finger 33b. The field plate interconnection 35b connects the field plate finger 35a with the source interconnection 42 crossing the gate electrode 33, exactly, the gate finger 33b.

The field plate 35 may suppress coupling between the gate electrode 33 and the drain electrode 31, and moderate field strength concentrated at an edge of the gate electrode 33, exactly, the edge in a side of the drain electrode 31. The moderation of the field strength may improve current collapse in the drain current, where the current collapse may be explained as reduction of the drain current just after a recovery from a status where the transistor is deeply turned off. That is, the field plate 35 may reduce the decrease of the drain current just after the transistor recovers from a turn-off state. The field plate 35 may be formed thin compared with the gate electrode 33; specifically, nickel (Ni) in the field plate 35 has a thickness of 2 to 100 nm and gold (Au) has a thickness of 50 to 500 nm, where the embodiment provides Ni with a thickness of 10 nm and Au with a thickness of 200 nm.

The field plate interconnection 35 provided in the second inactive region B12 does not overlap with the gate electrode 33. The field plate interconnection 35b connects the field plate finger 35a with the source interconnection 42 in the second inactive region B12. That is, the field plate interconnection 35b extends parallel to the edge A1b of the active region A1 crossing the gate electrode 33 and continues to the field plate finger 35a.

Further specifically, referring to FIG. 2B, the field plate interconnection 35b provides a portion overlapping with the gate finger 33b and the other portion extending on the second insulating film 22 from the gate finger 33b to the source finger 42b. The field plate interconnection 35b, as described above, extends in the second inactive region B12 along the edge A1b of the active region from the field plate finger 35a as crossing the gate finger 33b.

The transistor 1A of the present embodiment sets a distance L1 between the drain bus 41a and the active region A1, exactly, the edge A1a of the active region to be, for instance, 20 μm; a distance L2 between the electrodes of the drain 31 and the source 32 to be 5 μm, a distance L3 between the gate electrode 33, exactly, the gate finger 33b, and the source electrode 32 to be 1 μm, a width W1 of the field plate finger 35a to be 1 μm, and a width W2 of the field plate interconnection to be 1 μm.

Next, a process of forming the transistor 1A will be described referring to FIG. 3, FIG. 5, FIG. 7, and FIG. 9 are plan views of the transistor 1A at respective steps of forming the transistor 1A, while, FIG. 4A to FIG. 4C, FIG. 6A to FIG. 6C, FIG. 8A to FIG. 8C, and FIG. 10A to FIG. 10C are cross sectional views of the transistor 1A at the respective steps showing in FIG. 3 to FIG. 9, where those cross sections are taken along lines Na-Na, Nb-Nb, and Nc-Nc each indicated in the corresponding drawings, where N is IV, VI, VIII, and X of Roman numerals.

Referring to FIG. 3 and FIG. 4A to FIG. 4C, the process first epitaxially grows a channel layer 12 and a barrier layer 13 on a substrate 11 by metal organic chemical vapor deposition (MOCVD) technique to form a semiconductor stack 18 on the substrate 11. Thereafter, implanting heavy ions, for instance, argon ions Ar$^+$, within an area to be converted into the inactive region B1 by covering rest region that is converted into the active region A1 with a photoresist. Thereafter, the process deposits the first insulating film 21 by technique of, for instance, a low pressure chemical vapor deposition (LPCVD), a plasma-assisted chemical vapor deposition (p-CVD), and so on. Forming a pair of openings 21b in the first insulating film 21 and filling the openings with stacked metals of titanium (Ti) and aluminum (Al), where Ti is replaceable to tantalum (Ta), and alloying the stacked metals; a non-rectified contact to the semiconductor stack 18 may be formed as ohmic electrodes of the drain electrode 31 and the source electrode 32. Metal evaporation may stack those metals for the ohmic electrode.

Figure 6A:
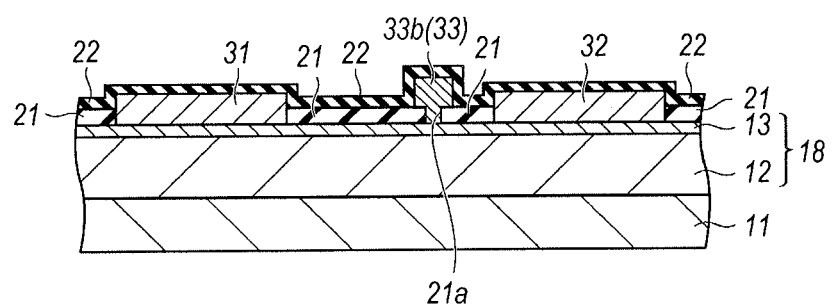
FIG. 6A to FIG. 6C are cross sectional views of the transistor at the step of the process, where the cross sectional views are taken along lines, VIa-VIa, VIb-VIb, and VIc-VIc, respectively, each indicated in FIG. 5.
Figure 6B:
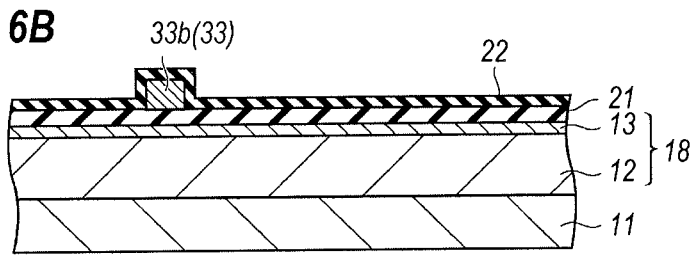
Figure 6C:
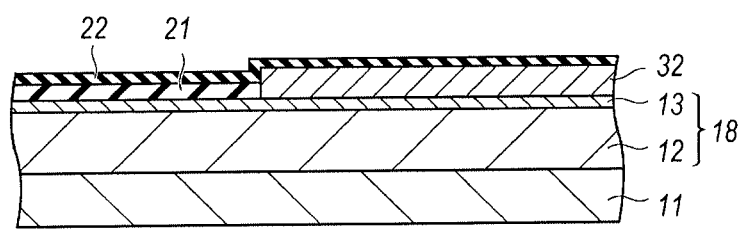
Figure 7:
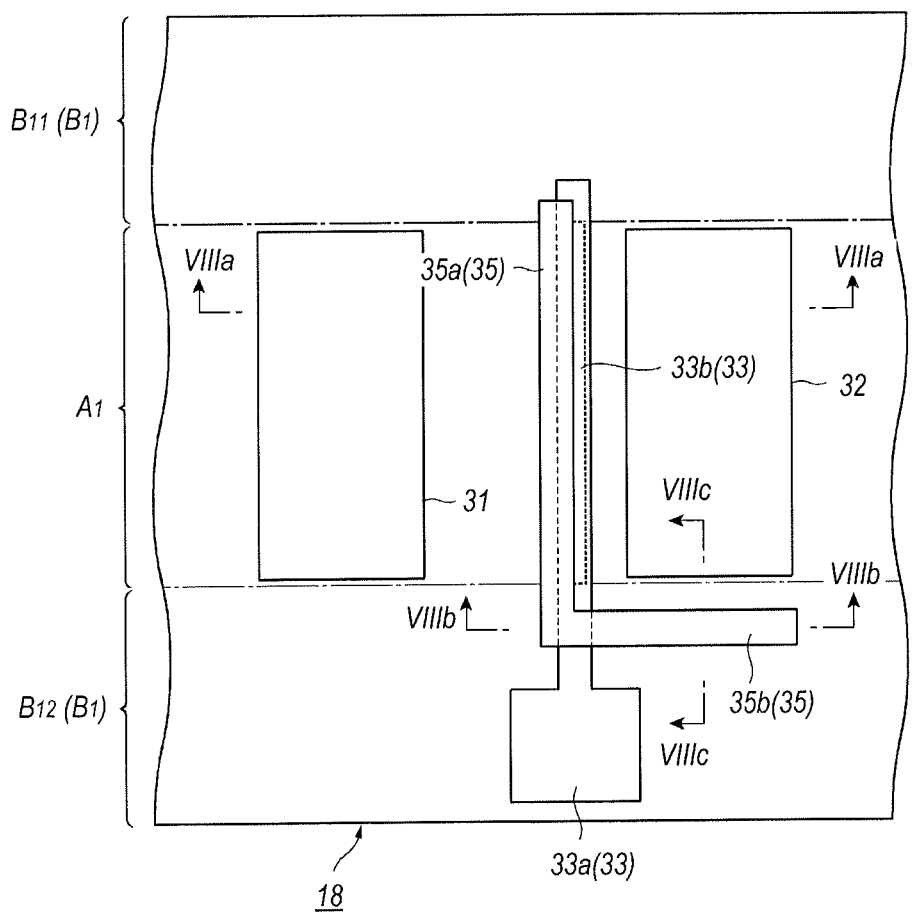
FIG. 7 is a plan view of the transistor at a step of the process subsequent to that shown in FIG. 5.
Figure 8A:
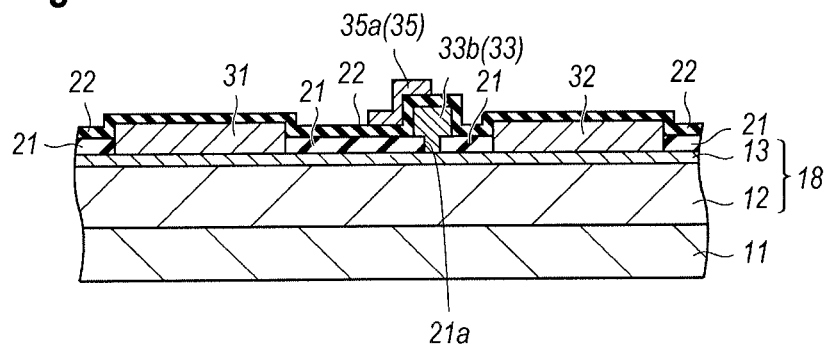
FIG. 8A to FIG. 8C are cross sectional views of the transistor at the step of the process, where the cross sectional views are taken along lines, VIIIa-VIIIa, VIIIb-VIIIb, and VIIIc-VIIIc, respectively, each indicated in FIG. 7.
Figure 8B:
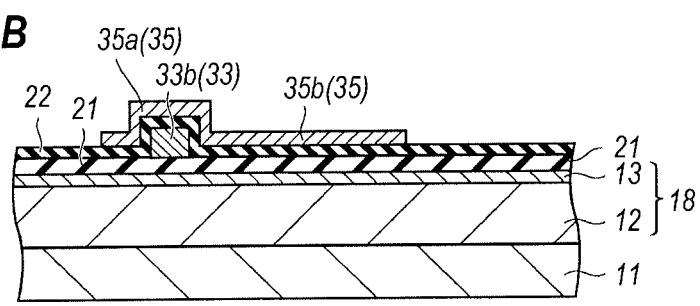
Figure 8C:
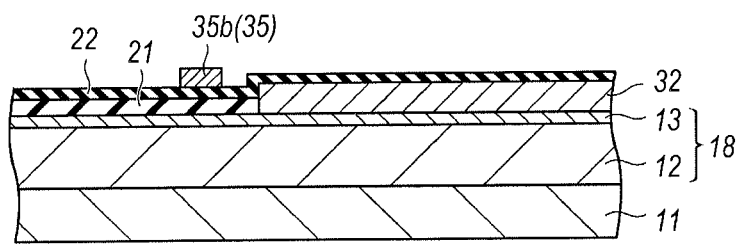
Figure 9:
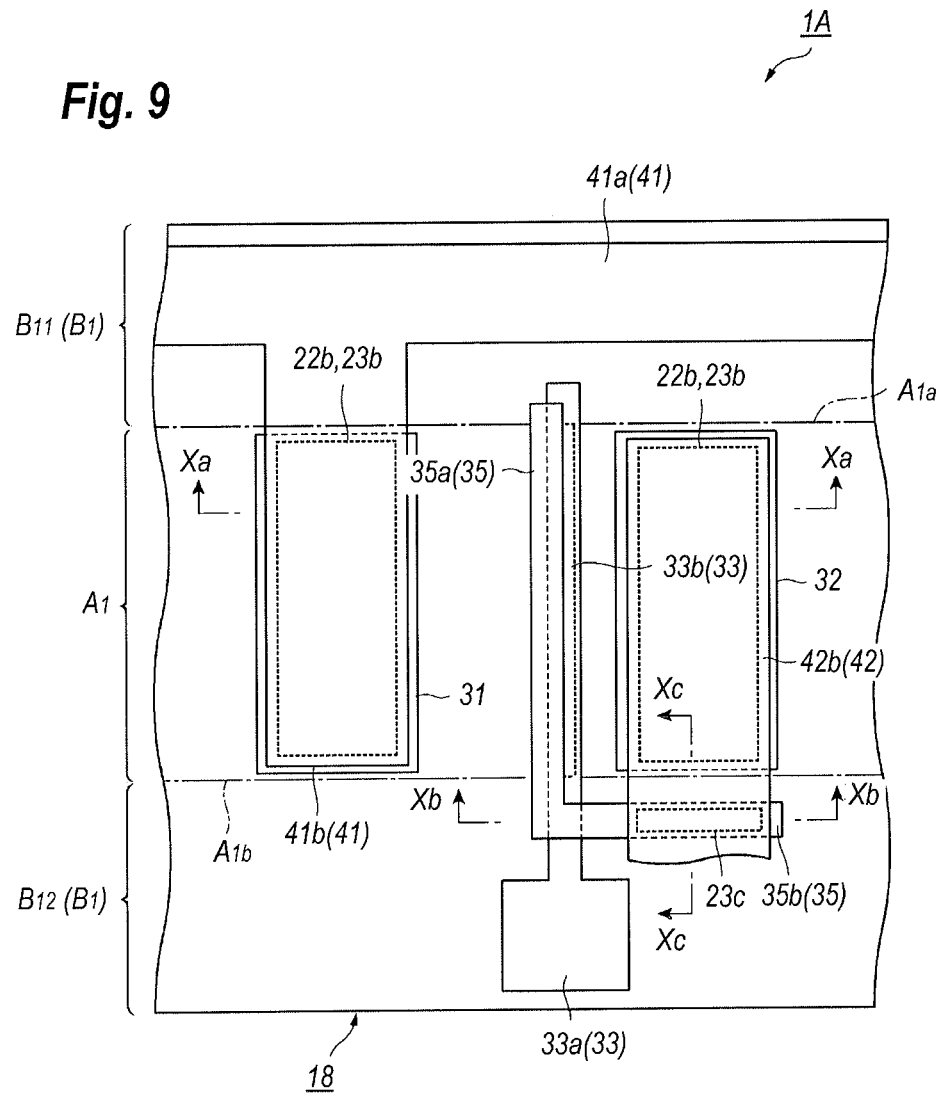
FIG. 9 is a plan view of the transistor at a step of the process subsequent to that shown in FIG. 7.
Figure 10A:
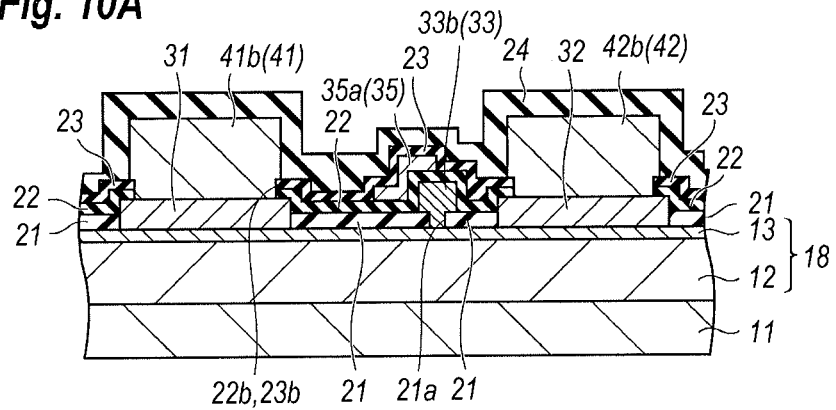
FIG. 10A to FIG. 10C are cross sectional views of the transistor at the step of the process, where the cross sectional views are taken along lines, Xa-Xa, Xb-Xb, and Xc-Xc, respectively, each indicated in FIG. 9.
Figure 10B:
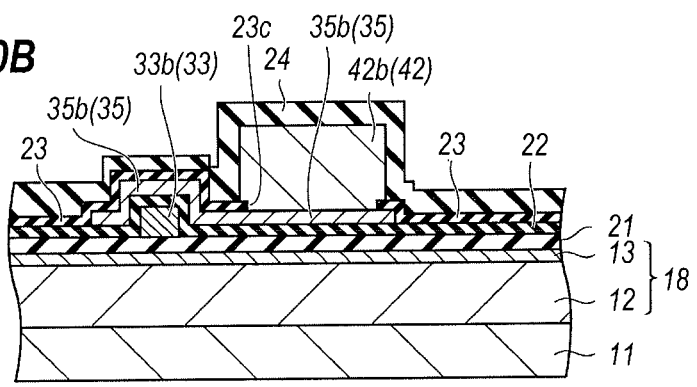
Figure 10C:
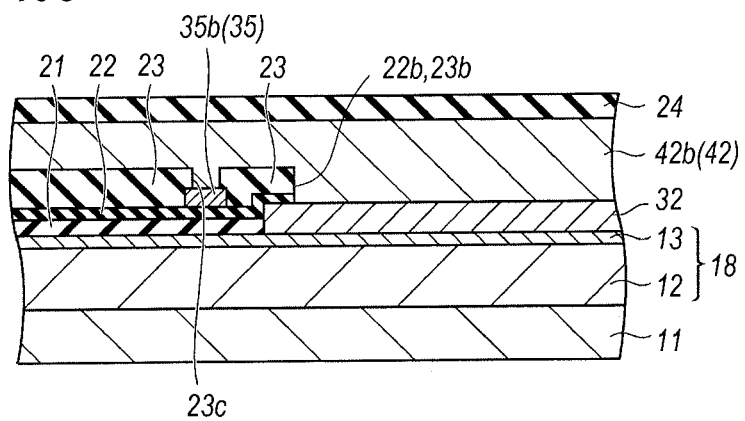

Referring to FIG. 5 and FIG. 6A to FIG. 6C, the process thereafter carries out a photolithography, or an electron beam (EB) lithography to form a patterned photoresist that covers the first insulating film 21, where the patterned photoresist provides an opening corresponding to the gate electrode 33. The first insulating film 21 is selectively etched by reactive ion etching (RIE) technique using the patterned photoresist as an etching mask, where the opening 21a formed in the first insulating film 21 may be called as a gate opening 21a. Removing the patterned photoresist, forming another patterned photoresist that provides an opening fully exposing the gate opening 21a in the first insulating film 21, the gate pad 33a and the gate finger 33b are formed in the second inactive region B12 and in the active region A1, respectively. Metals of the gate electrode 33 are formed by the metal evaporation. The gate opening 21a and the gate finger 33b are provided in the active region A1, while, the gate pad 33a is provided in the second inactive region B12. Thereafter, as shown in FIG. 6A to FIG. 6C, the second insulating film 22 fully covers the electrodes of the drain 31, the source 32, the gate finger 33b, and the gate pad 33a; that is the second insulating film 22 fully covers the nitride semiconductor stack 18. The second insulating film 22 may be formed by the plasma-assisted CVD (p-CVD).

Referring to FIG. 7 and FIG. 8A to FIG. 8C, the process subsequently forms the field plate 35 including the field plate finger 35a and the field plate interconnection 35b. Specifically, a patterned photoresist with an opening corresponding to the file plate 35 is formed on the second insulating film 22. Thereafter, the metal evaporation stacks metals on the second insulating film 22. Residual metals accumulated on the patterned photoresist may be removed by solving the patterned photoresist with organic solvent, which is called the metal lift-off technique. The field plate finger extends along the longitudinal direction of the electrodes, 31 to 33, that is, the direction connecting two edges, A1a and A1b, of the active region A1; while, the field plate interconnection 35b extends parallel to the edges, A1a and A1b, of the active region A1, which means that the field plate interconnection 35b makes a right angle against the field plate finger 35a. Also, the field plate interconnection 35b crosses over the gate finger 33b in the second inactive region B12.

Referring to FIG. 9 and FIG. 10A to FIG. 10C, the third insulating film 23 covers the whole field plate finger 35a and the field plate interconnection 35b. Thereafter, the process forms an opening 23c so as to expose the field plate interconnection 35b in the second inactive region B12. Concurrently with the formation of the opening 23c, the process forms another openings, 22b and 23b, in the second and third insulating films, 22 and 23, such that the openings, 22b and 23b, exposes surfaces of the drain electrode 31 and the source electrode 32. Because the field plate interconnection 35b is covered only with the third insulating film, the process forms the opening 23c only in the third insulating film 23. On the other hand, the electrodes of the drain 31 and the source 32 are covered with the second and third insulating films, 22 and 23; the process forms the openings, 22b and 23b, in the respective films continuously. Then, forming the drain interconnection 41 and the source interconnection 42 such that respective drain and source fingers, 41b and 42b, are in direct contact with the drain and source electrodes, 31 and 32, through the openings, 22b and 23b, and the field plate interconnection 35b in particular, the source finger 42b is connected with the field plate interconnection 35b through the opening 23c. The field plate 35 is connected nowhere except for the source finger 42b through the opening 23c. Also, the drain bus 41a and the source bus 42a are formed such that the respective drain and source buses, 41a and 42a, connect the drain and source fingers, 41b and 42b, in the inactive regions, B11 and B12. Finally, the fourth insulating film 24 covers the respective drain and source interconnections, 41 and 42. The third and fourth insulating films, 23 and 24, may be also formed by the p-CVD similar to the second insulating film 22. Thus, the process of forming the transistor 1A is completed.

Figure 27:
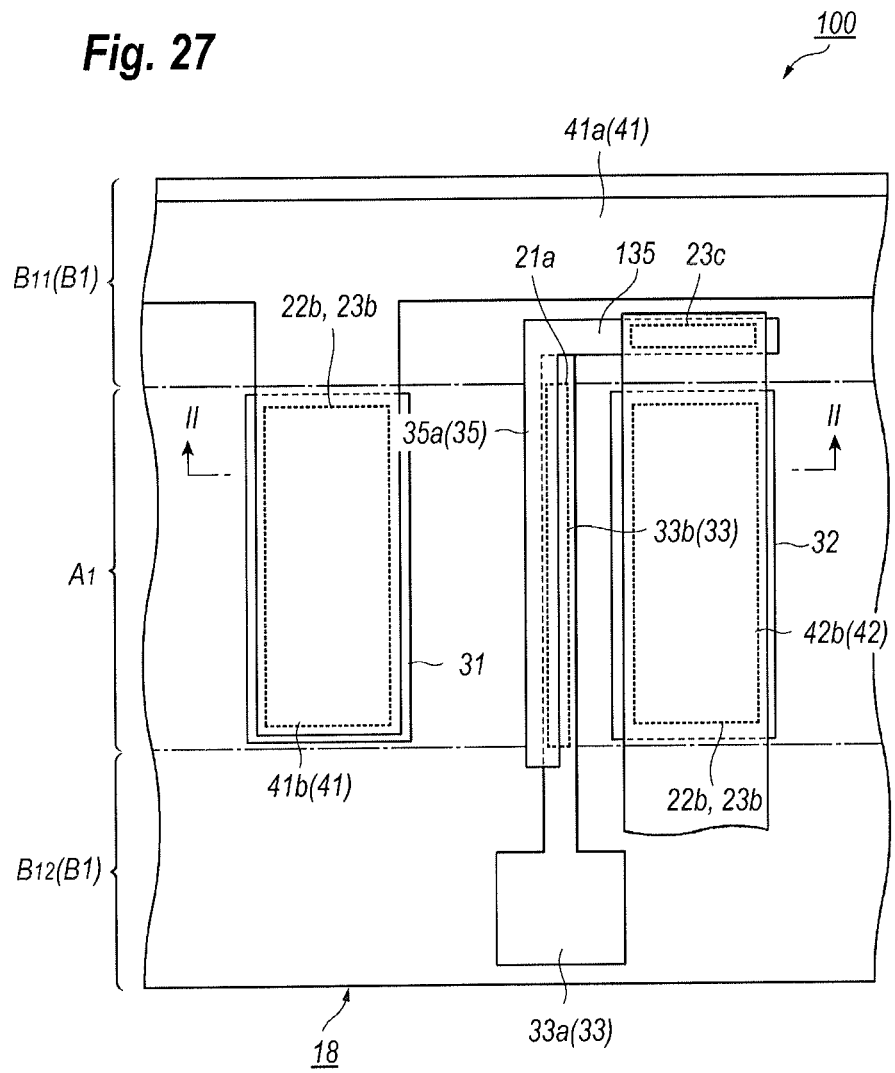
FIG. 27 is a plan view showing a transistor having a conventional disposition of the field plate interconnection.

The transistor 1A and the process of forming the transistor 1A are compared with a conventional transistor and a conventional process. FIG. 27 is a plan view of a conventional transistor 100 that provides the field plate interconnection 135 extends between the source electrode 32 and the drain bus 41a in the first inactive region B11; while, the source finger 42b extends toward the drain bus 41a also in the first inactive region B11 to be connected with the field plate interconnection 135 through the opening 23c in the third insulating film 23. In the conventional arrangement shown in FIG. 27, the field plate interconnection 135 is placed closer to the drain bus 41a, which increases parasitic capacitance $C_{ds}$ between the drain electrode and the source electrode. Because field plate interconnection 135 is connected with the source electrode 32, parasitic capacitance may be also induced between the field plate interconnection 135 and the drain bus 41a.

The transistor 1A according to the present embodiment provides the field plate interconnection 35b in the second inactive region B12; specifically, the field plate interconnection 35b extends from the field plate finger 35a to the source finger 42b crossing the gate finger 33b in the second inactive region B12. This arrangement may place the field plate interconnection 35b that is electrically connected with the source electrode 32 apart from the drain bus 41a and may suppress the increment of the drain-source parasitic capacitance $C_{ds}$.

The conventional transistor 100 may be estimated to cause the parasitic capacitance $C_{ds}$ of 0.211 pF/mm; while, the arrangement of the present embodiment shown in FIG. 1 may reduce the parasitic capacitance thereof to 0.205 pF/mm; that is, the arrangement according to the present embodiment may achieve 3% reduction in the drain-source parasitic capacitance $C_{ds}$.

First Modification

Figure 12:
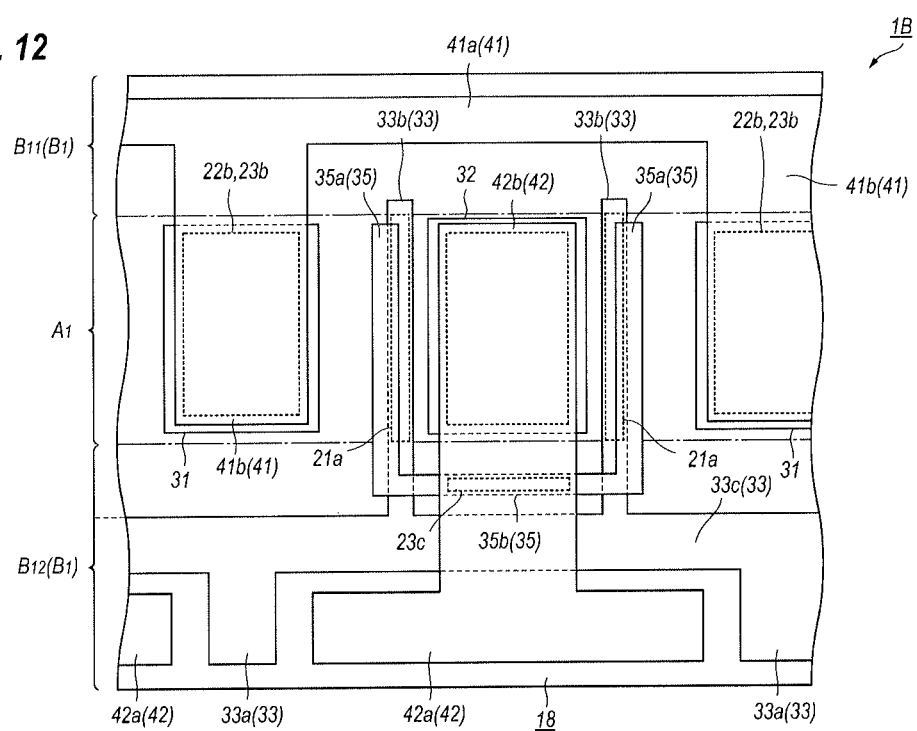
FIG. 12 is a plan view magnifying a primary portion of the transistor shown in FIG. 11.

FIG. 11 is a plan view of a transistor 1B that is modified from the transistor 1A shown in FIG. 1, and FIG. 12 is also a plan view of the transistor 1B that magnifies a primary portion thereof. The transistor 1B of the first modification provides a plurality of the drain electrodes 31 the source electrodes 32 alternately disposed along the direction perpendicular to the direction of the respective drain and source fingers, 41b and 42b. The gate electrodes 33 are each disposed between the one drain electrode 31 and the one source electrode 32 next to the one drain electrode 31. Moreover, the transistor 1B provides a plurality of field plates 35 each partially overlapping with the one gate electrode 33 and extending between the one gate electrode 33 and the one drain electrode 31. The gate electrode 33 accompanied with the field plate 35, the drain electrode 31, and the source electrode 32 sandwiching the gate electrode 33 and the field plate 35 constitute one transistor element. That is, the transistor 1B of the first modification shown in FIG. 11 comprises a plurality of transistor elements. The transistor 1B further provides a gate bus 33c that connects the gate fingers 33b in respective transistor elements with the gate pad 33a provided in a periphery of the second inactive region B12. That is, the gate bus 33c extends along the edge of the active region A1 as forming the gate pads 33a outwardly with respect to the active region A1.

The modified transistor 1B also provides the source buses 42a and the source fingers 42b, where the source buses 42a operate as source pads and constitute the source interconnection combined with the source fingers 42b. The source pads 42a are each connected with the one source finger 42b but for two transistor elements, that is, two transistor elements commonly provides the one source pad 42a and the one source finger 42b. The source pads 42a and the gate pads 33a are alternately disposed along the direction perpendicular to the extending direction of the respective gate and source fingers, 33b and 42b. The source pads 42a each provide a width greater than a width of the source finger 42b; that is, the source interconnection 42 in the two transistor elements has a plane shape of the T-character.

In the two transistor elements commonly providing the one source electrode 32, the one source finger 42b, and the one source pad 42a; the two field plate fingers 35a are commonly connected with the field plate interconnection 35b, and this field plate interconnection 35b is connected with the source finger 42b through the opening 23c. Specifically, the field plate interconnection 35b is pulled out from one end of the field plate finger 35a, extends parallel to the edge of the active region A1, crosses over the gate finger 33b, and hides under the source finger 42b to be connected with the source finger 42b through the opening 23c. Thus, the transistor 1B may provide a plurality of transistor elements comprising the drain electrode 31, the source electrode 32, the gate electrode 33, and the field plate 35, where the drain electrode 31 is jointly owned by anther transistor element disposed next to the present transistor element and the source electrode 32 is also jointly owned by still another transistor element disposed next to but disposed in an opposite side with respect to the former transistor element.

Second Modification

Figure 13:
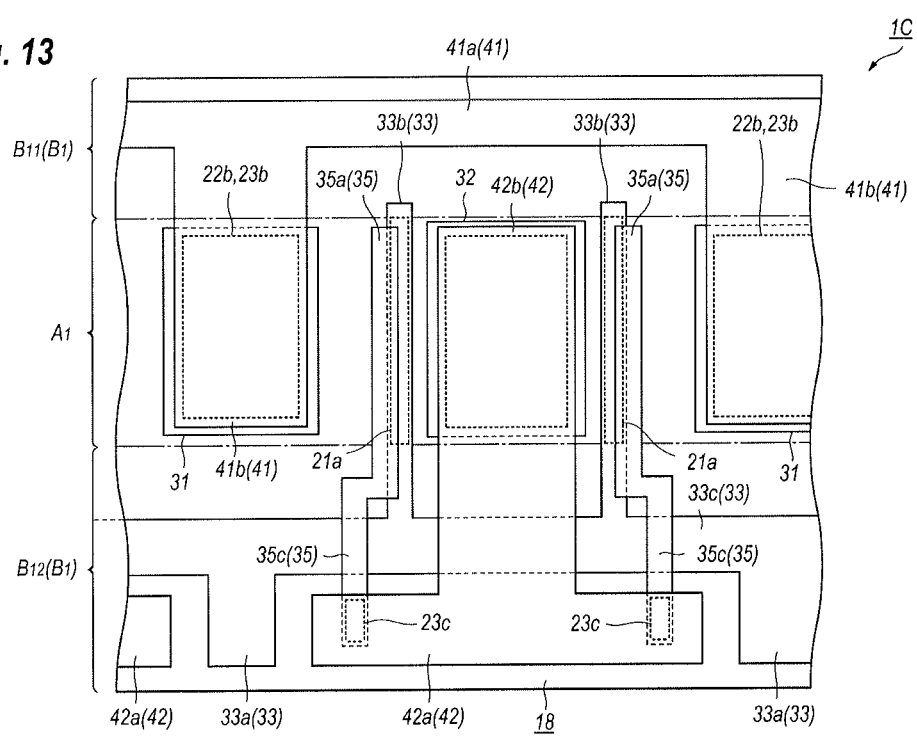
FIG. 13 is a plan view of another transistor according to the second modification of the transistor shown in FIG. 1.

FIG. 13 is a plan view of another transistor 1C that is also modified from the transistor 1A, where the transistor 1C has a feature distinguishable from the former transistor 1B that the transistor 1C provides the field plate 35 in a plane shape thereof different from that of the former transistor 1B. That is, the field plate 35 of the present modification provides a field plate interconnection 35c drawn from the field plate finger 35a but connected with the source pad 42a not the source finger 42b through the opening 23c in the third insulating film 23. Specifically, the field plate interconnection 35c is pulled out from the field plate finger 35a along the edge of the active region A1; bent by a right angle toward the source pad 42a; crosses over the gate bus 33c; hides under the source pad 42a; and connected with the source pad 42a through the opening 23c in the third insulating film 23. Thus, the field plate interconnection 35c may cross the gate bus 33c not the gate finger 33b.

Third Modification

Figure 14:
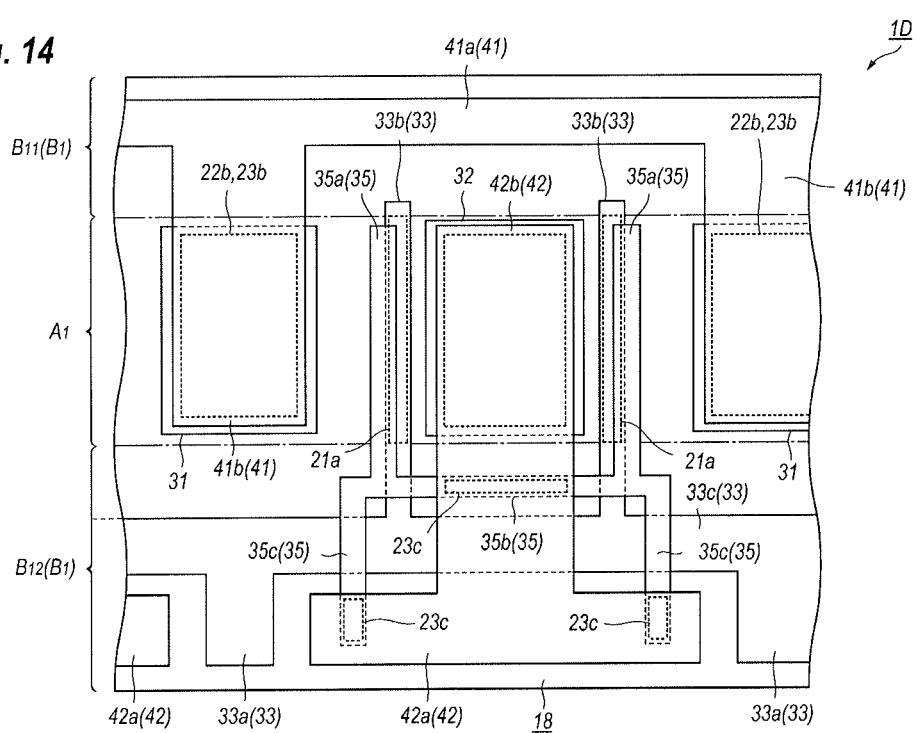
FIG. 14 is a plan view of still another transistor according to the third modification of the transistor shown in FIG. 1.

FIG. 14 is a plan view of still another transistor 1D that is also modified from the transistor 1A according to the first embodiment. The transistor 1D of the present modification provides another field plate interconnection whose plane shape is different from those of the aforementioned modifications. That is, the field plate 35 of the present modification provides two field plate interconnections, 35b and 35c, where the former 35b appears in the first modification 1B shown in FIG. 12, while, the latter interconnection 35c is provided in the second modification 1C shown in FIG. 13. The field plate 35 in the present modification may show the function same with those appearing in the first and the second modifications.

Fourth Modification

Figure 15:
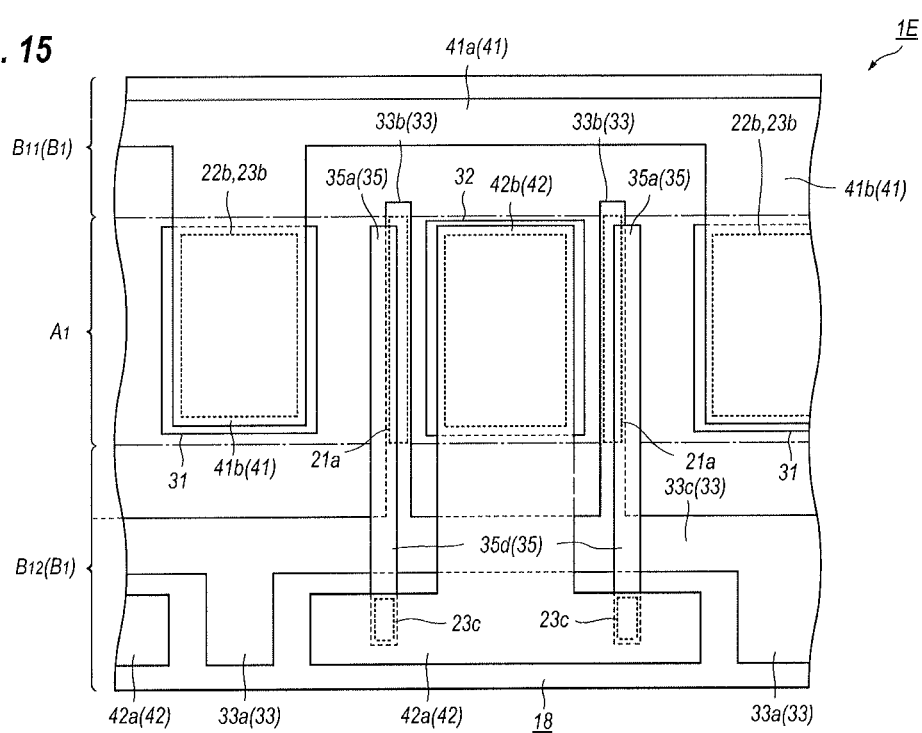
FIG. 15 is a plan view of still another transistor according to the fourth modification of the transistor shown in FIG. 1.

FIG. 15 is also a plan view of a transistor 1E modified from the transistor 1B shown in FIG. 12. The transistor 1E of the present modification provides a field plate 35 with a shape different from those of the aforementioned modifications, 1B to 1D. That is, the field plate 35 of the present modification provides a field plate interconnection 35d drawn from the field plate finger 35a in straight, crossing over the gate bus 33c, hides under the source pad 42a, and connects with the source pad 42a through the opening 23c. The field plate 35 of the present modification may show a function same with those of the aforementioned field plate 35.

Fifth Modification

Figure 16:
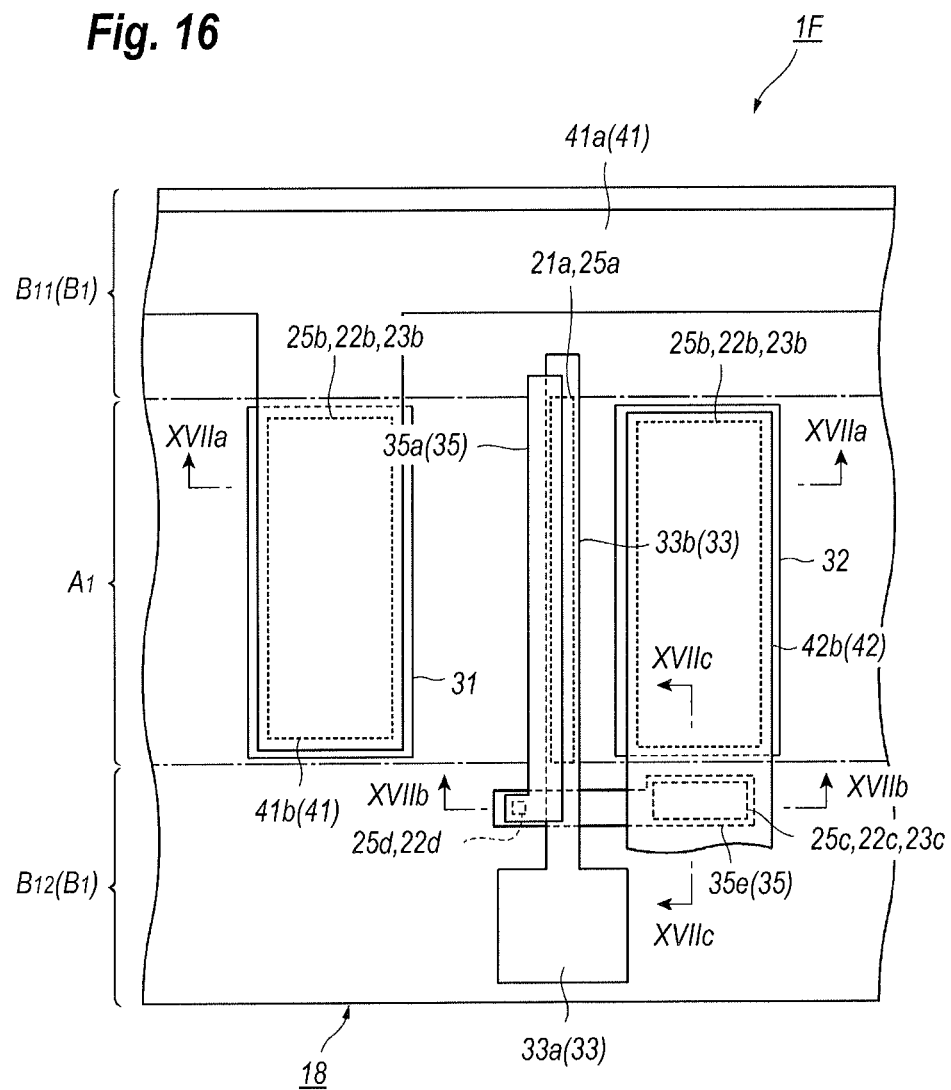
FIG. 16 is a plan view of still another transistor according to the fifth modification of the transistor shown in FIG. 1.
Figure 17A:
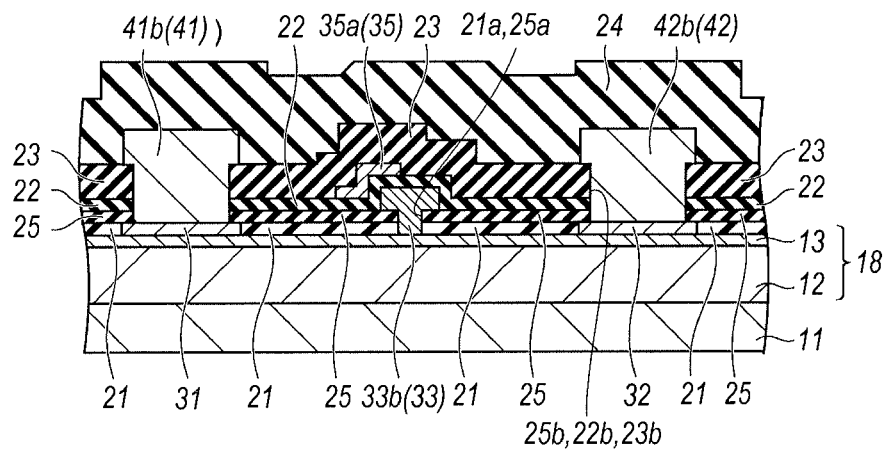
FIG. 17A to FIG. 17C are cross sectional views of the transistor shown in FIG. 16, where the views are taken along lines, XVIIa-XVIIa, XVIIb-XVIIb- and XVIIc-XVIIc, indicated in FIG. 16, respectively.
Figure 17B:
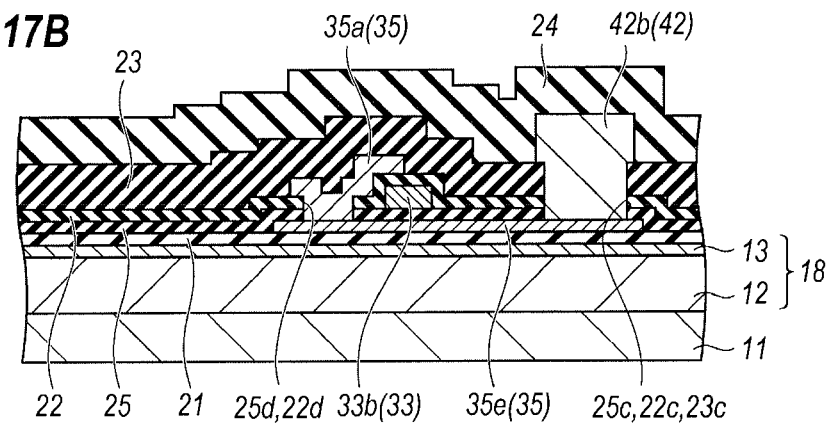
Figure 17C:
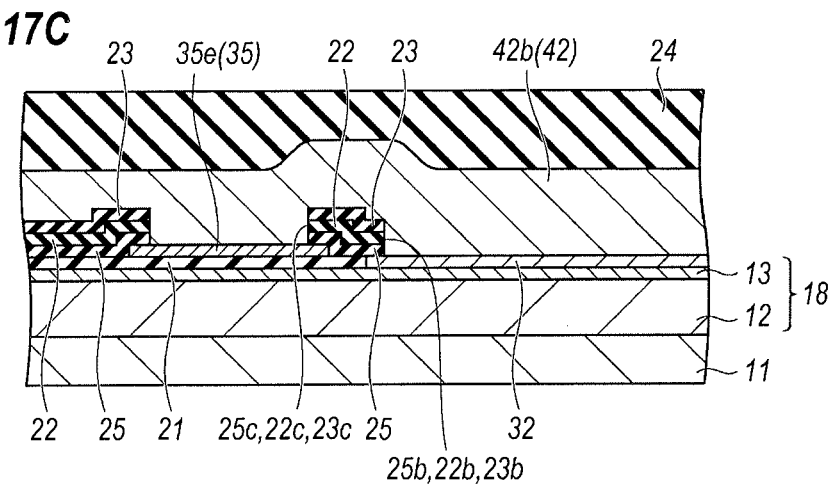
Figure 18:
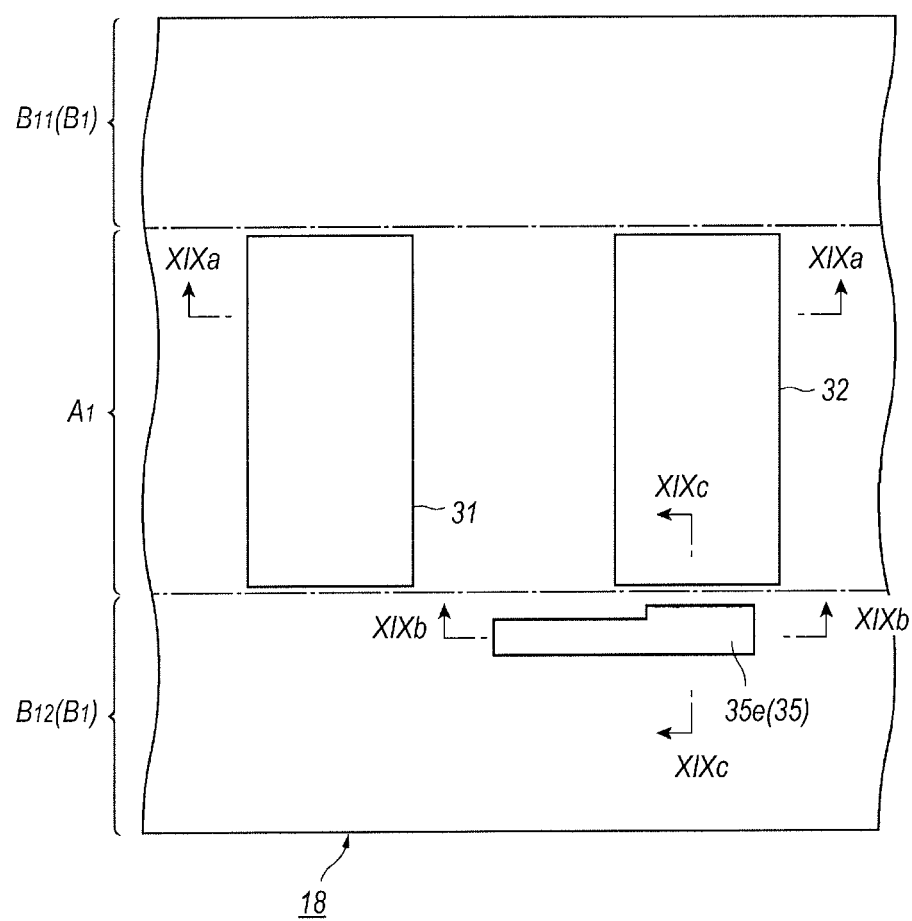
FIG. 18 is a plan view of the transistor shown in FIG. 16 at a step of the process of forming the transistor.
Figure 19A:
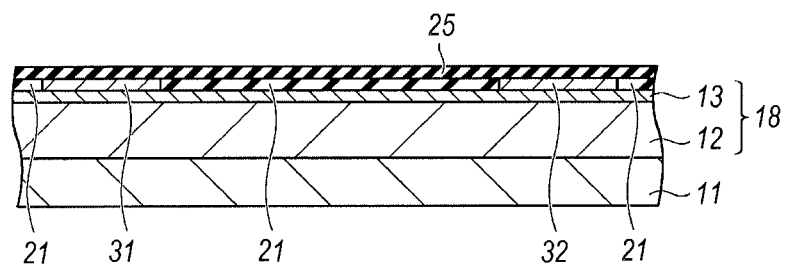
FIG. 19A to FIG. 19C are cross sectional views of the transistor shown in FIG. 16 at the step of the process, where the cross sectional views are taken along lines, XIXa-XIXa, XIXb-XIXb, and XIXc-XIXc, respectively, each indicated in FIG. 18.
Figure 19B:
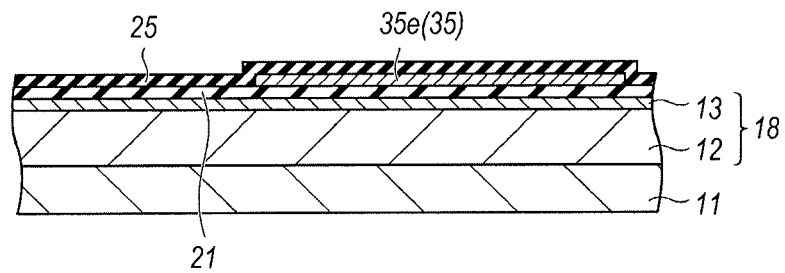
Figure 19C:
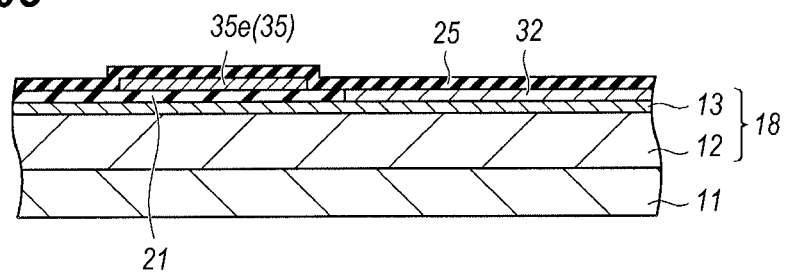

FIG. 16 is also a plan view of a transistor 1F modified from the transistor 1B shown in FIG. 12; and FIG. 17A to FIG. 17C are cross sectional views of the modified transistor 1F each taken along the line XVIIa-XVIIa, XVIIb-XVIIb, and XVIIc-XVIIc, respectively, indicated in FIG. 16.

The transistor 1F of the present modification has a feature distinguishable from the transistor 1A that the field plate 35 of the present modification provides an extra field plate interconnection 35e connected with the field plate finger 35a through openings, 25d and 22d, formed in an additional insulating film 25 and the second insulating film 22, and also connected with the source finger 42*b* through openings, 25*c*, 22*c*, and 23*c*, formed in the additional insulating film 25, the second insulating film 22, and the third insulating film 23. Specifically, the field plate interconnection 35*e* extends perpendicular to the field plate finger 35*a*; crosses under the gate finger 33*b*, and hides under the source finger 42*b*. That is, the field plate interconnection 35*e* of the present modification is physically divided from the field plate finger 35*a*, while, the gate pad 33*a* and the gate finger 33*b* are formed after the formation of the field plate interconnection 35*e*.

As shown in FIG. 17B and FIG. 17*c*, the field plate interconnection 35*e* of the present modification is provided on the first insulating film 21 but under the additional insulating film 25. Specifically, the field plate interconnection 35*e*, which is connected with the field plate finger 35*a* through openings, 25*d* and 22*d*, formed in the additional insulating film 25 and the second insulating film 22, runs between the first insulating film 21 and the additional insulating film 25 at a region intersecting the gate finger 33*b*, and connects with the source finger 42*b* through the openings, 25*c*, 22*c*, and 23*c*, provided in the respective insulating films, 25, 22, and 23. That is, the additional insulating film 25 isolates the field plate interconnection 35*e* from the gate finger 33*b*. Because the field plate interconnection 35*e* of the present modification runs under the gate finger 33*b* not crosses over the gate finger 33*b*, the field plate interconnection 35*e* becomes free from breakages at steep edges of the gate finger 33*b*.

Next, a process of forming the modified transistor 1F shown in FIG. 16 will be described referring to FIG. 18 to FIG. 25, where FIG. 18, FIG. 20, FIG. 22, and FIG. 24 are plan views of the transistor 1F at respective steps of the process of forming the transistor 1F; while, FIG. 19A to FIG. 19C, FIG. 21A to FIG. 21C, FIG. 23A to FIG. 23C, and FIG. 25A to FIG. 25C, are cross sectional views of the transistor 1F at respective steps of the process, where the drawings A to C in respective figures are taken along the respective lines indicated in the plan views corresponding thereto.

The process of forming the modified transistor 1F first forms the semiconductor stack 18 on the substrate 11, where the semiconductor stack 18 includes the channel layer 12 and the barrier layer 13 from a side of the substrate 11. Then, ion implantation of heavy ions such as argon ($Ar^+$) is carried out to form the inactive regions, B11 and B12, in respective sides of the active region A1, where the active region A1 is free from the ion implantation. Thereafter, the whole surface of the semiconductor stack 18 is covered with the first insulating film 21 that is deposited by, for instance, the low pressure chemical vapor deposition (LPCVD) technique at a temperature of 800 to 900° C.; then the electrodes of the drain 31 and the source 32 are formed. Those steps of forming the semiconductor stack 18, the first insulating film 21, and the electrodes of the drain 31 and the source 32, are substantially same with those of the aforementioned embodiment.

Thereafter, the field plate interconnection 35*e* is formed on the first insulating film 21 in the second inactive region B12, where the field plate interconnection 35*e* may have stacked metals of titanium (Ti), platinum (Pt), gold (Au), another platinum, and another Ti, which may be denoted as Ti/Pt/Au/Pt/Ti, with respective thicknesses of 10 nm/10 nm/60 nm/10 nm/10 nm. The field plate interconnection 35*e* may have a total thickness around 100 nm, which is thinner than the electrodes of the drain 31 and the source 32. Because the field plate interconnection 35*e* is physically isolated from the electrodes of the drain 31 and the source 32, the field plate interconnection 35*e* may be formed in advance to the formation of the drain and source electrodes, 31 and 32. However, the electrodes, 31 and 32, inevitably accompany with the process of alloying metals at a temperature preferably higher than 500° C., the field plate interconnection 35*e* is preferably formed after the formation of the drain and source electrodes, 31 and 32, exactly, after the high temperature process of alloying the metals. The field plate interconnection 35*e*, the electrodes, 31 and 32, and the first insulating film 21 are covered with the additional insulating film 25 of SiN that is deposited by, for instance, the plasma-assisted CVD with a thickness around 60 nm.

Figure 20:
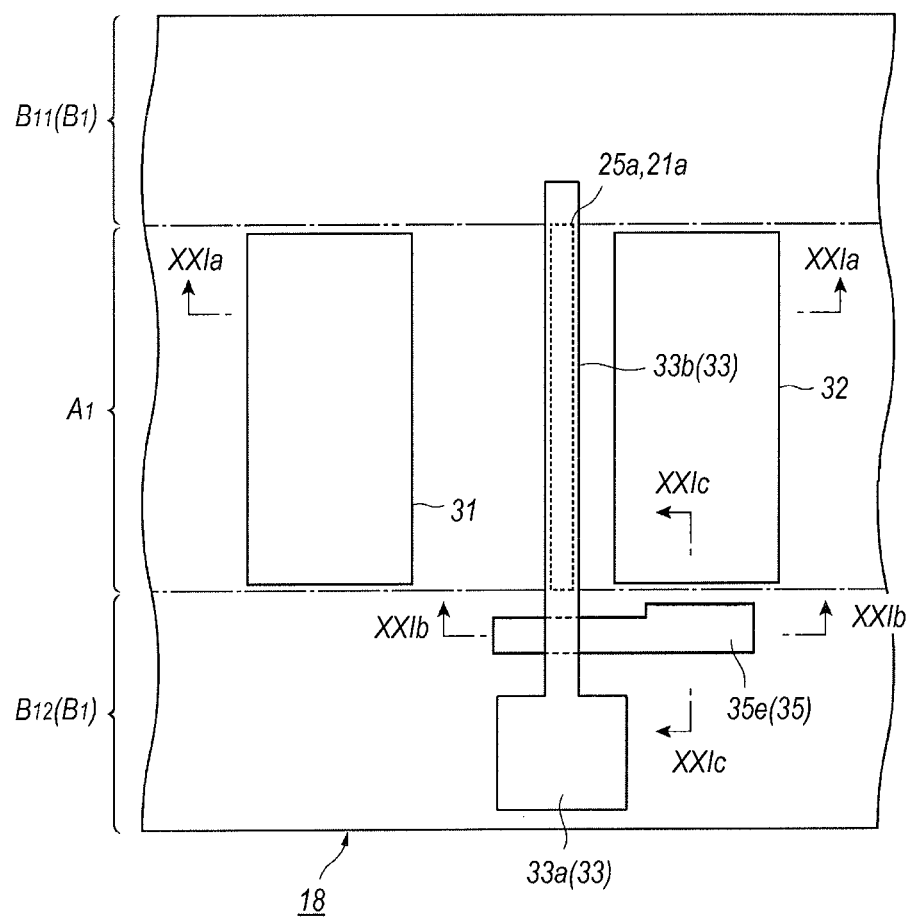
FIG. 20 is a plan view of the transistor shown in FIG. 16 at a step of the process subsequent to the step shown in FIG. 18.
Figure 21A:
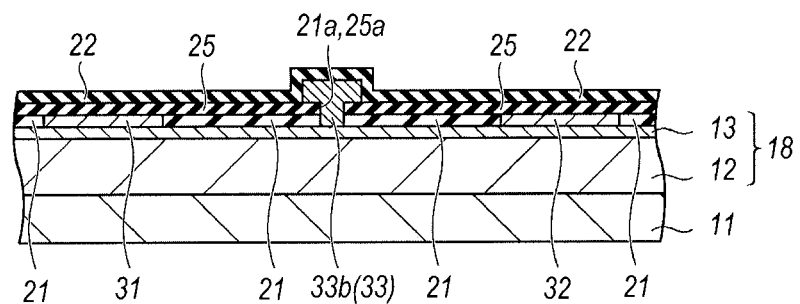
FIG. 21A to FIG. 21C are cross sectional views of the transistor shown in FIG. 16 at the step of the process, where the cross sectional views are taken along lines, XXIa-XXIa, XXIb-XXIb, and XXIc-XXIc, respectively, each indicated in FIG. 20.
Figure 21B:
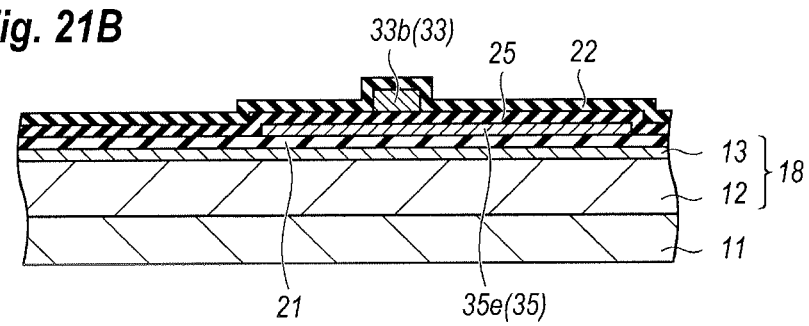
Figure 21C:
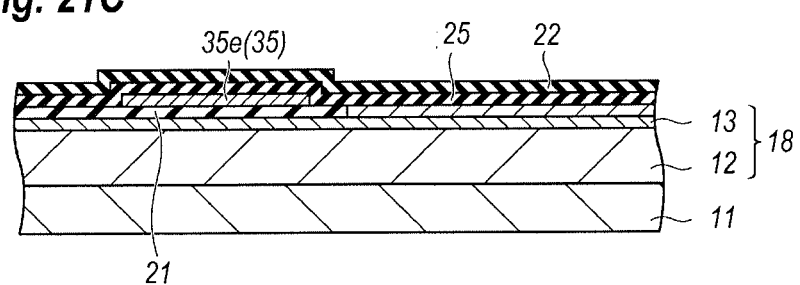
Figure 22:
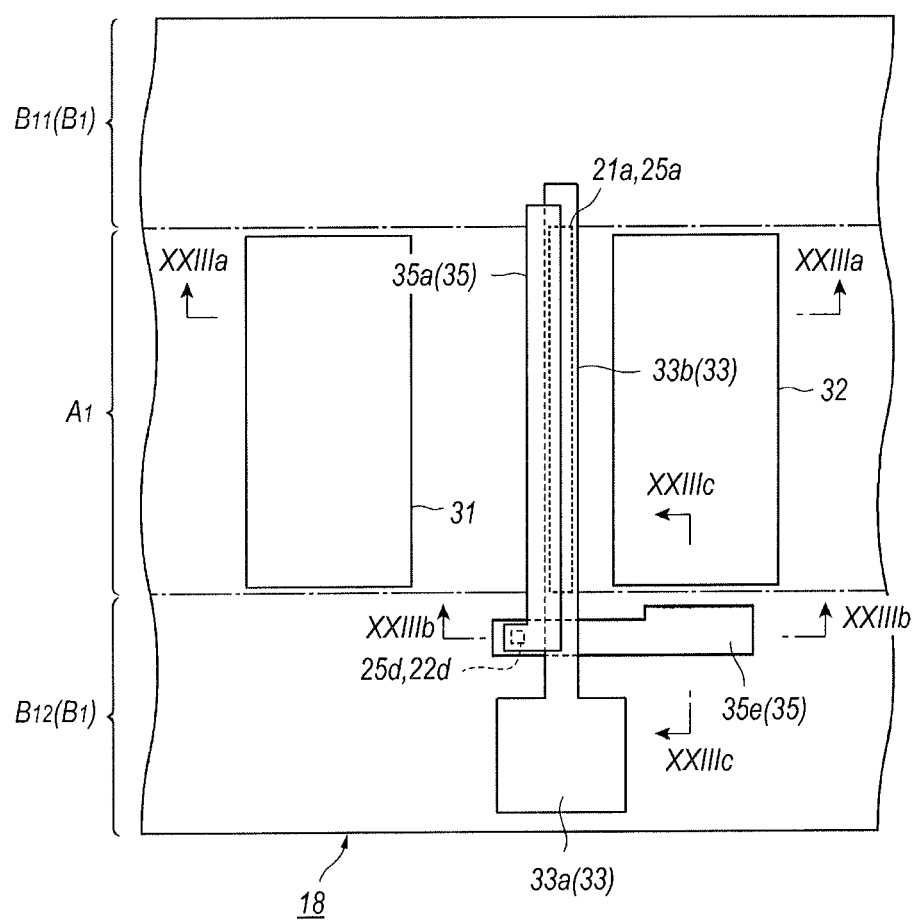
FIG. 22 is a plan view of the transistor shown in FIG. 16 at a step of the process subsequent to the step shown in FIG. 20.
Figure 23A:
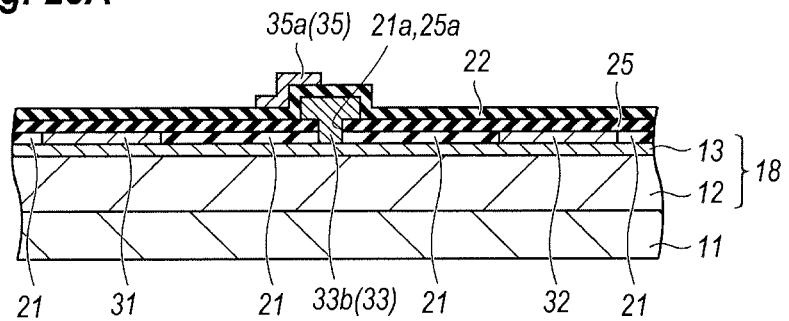
FIG. 23A to FIG. 23C are cross sectional views of the transistor shown in FIG. 16 at the step of the process, where the cross sectional views are taken along lines, XXIIIa-XXIIIa, XXIIIb-XXIIIb, and XXIIIc-XXIIIc, respectively, each indicated in FIG. 22.
Figure 23B:
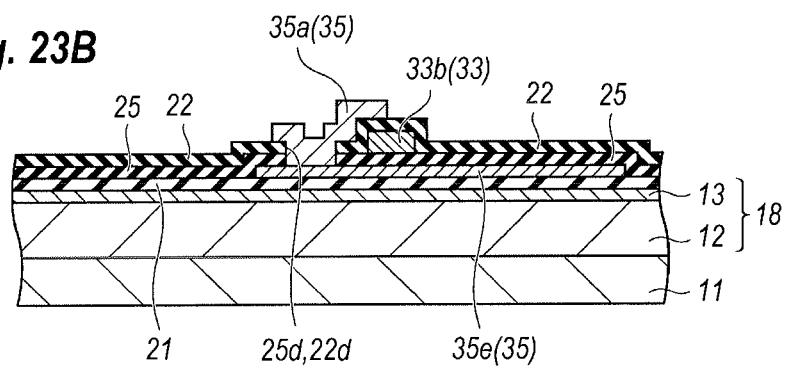
Figure 23C:
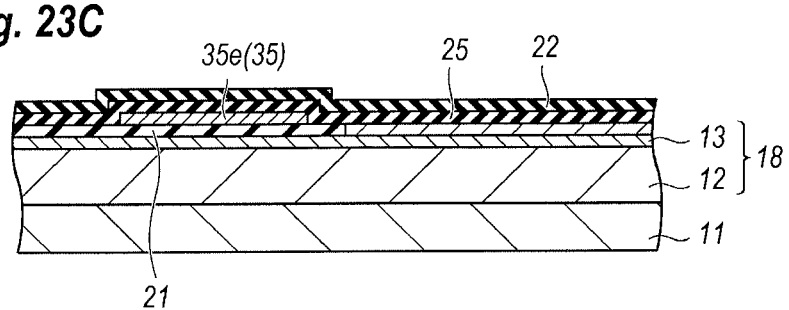
Figure 24:
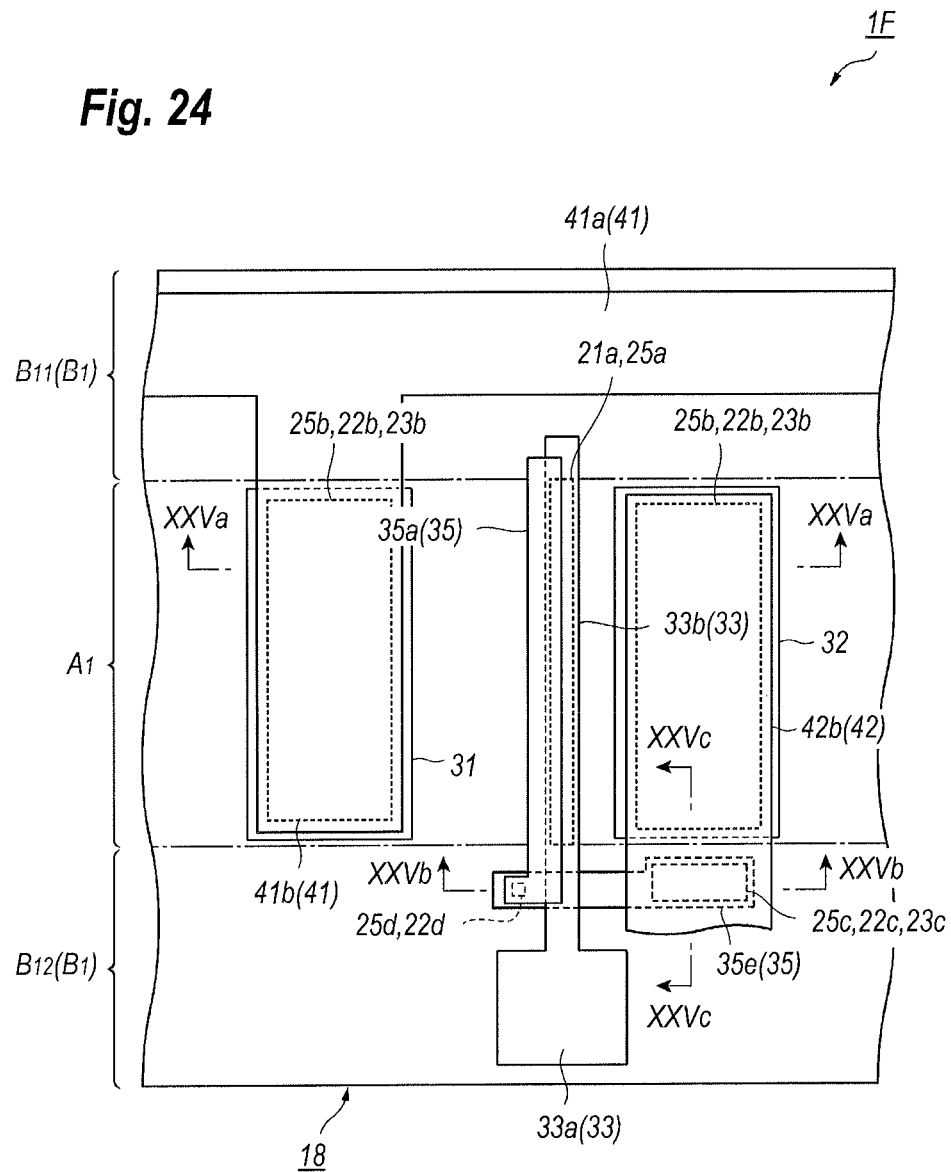
FIG. 24 is a plan view of the transistor shown in FIG. 16 at a step of the process subsequent to the step shown in FIG. 22.
Figure 25A:
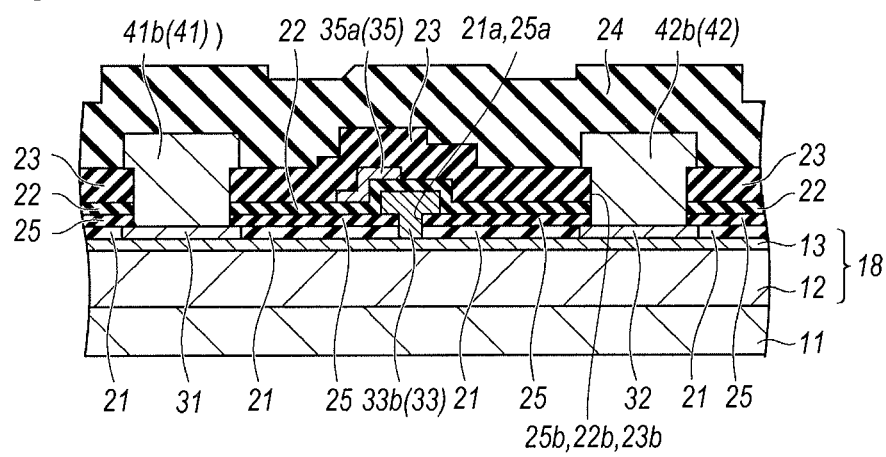
FIG. 25A to FIG. 25C are cross sectional views of the transistor shown in FIG. 16 at the step of the process, where the cross sectional views are taken along lines, XXVa-XXVa, XXVb-XXVb, and XXVc-XXVc, respectively, each indicated in FIG. 24.
Figure 25B:
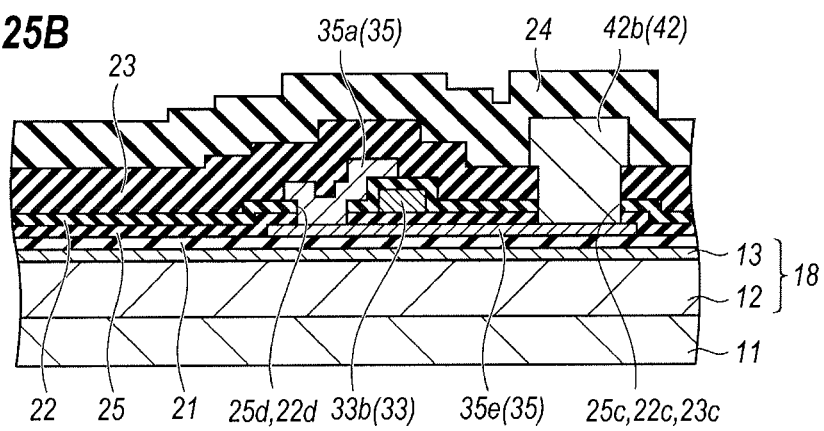
Figure 25C:
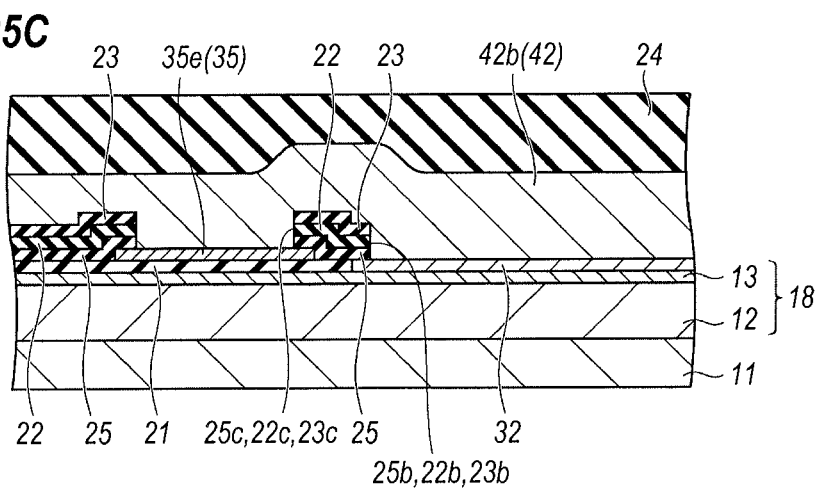

Thereafter, as shown in FIG. 20 and from FIG. 21A to FIG. 21C, the process forms the gate electrode 33 including the gate pad 33*a* and the gate finger 33*b*. Specifically, the process first forms openings, 21*a* and 25*a*, which are referred to as the gate opening, in the first insulating film 21 and the additional insulating film 25 by first forming a patterned photoresist with an opening corresponding to the gate opening, 21*a* and 25*a*; then, the two insulating films, 21 and 25, are dry-etched using a reactive gas containing fluorine (F) to expose a surface of the semiconductor stack 18. Re-forming another patterned photoresist that provides openings corresponding to the gate pad 33*a* and gate finger 33*b* on the additional insulating film 25 and depositing the gate metals including Ni and Au on the additional insulating film 25 and the semiconductor stack through the gate openings, 21*a* and 25*a*, the whole surface of the substrate 11 is covered with the second insulating film 22 as shown in FIG. 21A to FIG. 21C.

Thereafter, the process forms the openings, 25*d* and 22*d*, in the additional insulating film 25 and the second insulating film 22, where the openings, 25*d* and 22*d*, connects the field plate interconnection 35*e* with the field plate finger 35*a*. Referring to FIG. 22 and FIG. 23A to FIG. 23C, a patterned photoresist with an opening corresponding to the openings, 25*d* and 22*d*, is coated on the whole surface of the substrate 11; then the RIE using a reactive gas containing fluorine (F) continuously and sequentially etches the second insulating film 22 and the additional insulating film 25 to expose the surface of the field plate interconnection 35*e*. Then, another patterned photoresist is prepared on the second insulating film 22, where another patterned photoresist provides a pattern of the field plate finger 35*a*. Depositing the field plate finger 35*a* by, for instance, the metal evaporation, the field plate finger 35*a* connected with the field plate interconnection 35*e* through the opening, 22*d* and 25*d*, is formed on the second insulating film 22. Residual metals accumulated on the second patterned photoresist are removed by solving the second patterned photoresist with organic solvent. Thereafter, the process forms the third insulating film 23 on the whole surface of the second insulating film 22 so as to fully cover the field plate finger 35*a*.

Referring to FIG. 24 and FIG. 25A to FIG. 25C, the process thereafter forms the drain interconnection 41 and the source interconnection 42. Specifically, the RIE using a reactive gas containing fluorine (F) selectively etches the insulating films, 25, 22, and 23 corresponding to the electrodes of the drain 31 and the source 32, and the field plate interconnection 35*e*. Because the insulating films, 25, 22, and 23 are made of SiN, the RIE may form the openings, 25*b*, 22*b*, and 23*b*, and 25*c*, 22*c*, and 23*c*, piercing those insulating films, 25, 22, and 23, so as to expose the surface of the electrodes, 31 and 32, and the field plate interconnection 35*e*. Depositing metals for the interconnections of the drain 41 and the source 42, the process of forming the transistor 1F according to the present modification may be completed. In the modified transistor 1F, the field plate finger 35a, which shows the true function of the field plate 35, is electrically connected with the source electrode 32 through the openings, 25d and 22d, the field plate interconnection 35e, the openings, 25c, 22c, and 23c, and the source finger 42b, where the path from the field plate finger 35a to the source electrode 32 intersects with the gate finger 33b but passes under the gate finger 33b, which means that the path does not climb up the gate finger 33b; accordingly, the field plate finger 33a is securely connected with the source electrode 32. The possibility for the path from the field plate finger 35a to the source electrode 32 to be broken by steep edges of the gate finger 33b may be suppressed.

Figure 26A:
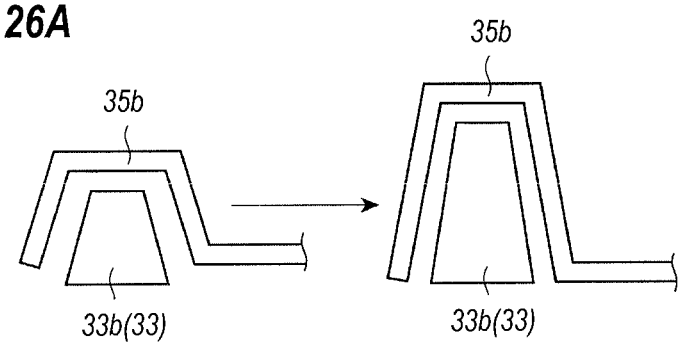
FIG. 26A and FIG. 26B schematically compare an arrangement of a field plate interconnection passing over (FIG. 26A) and under (FIG. 26B) a gate finger.
Figure 26B:
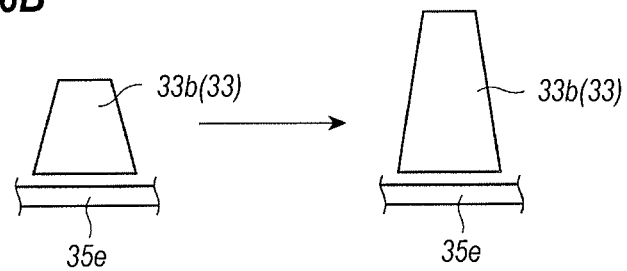

FIG. 26A and FIG. 26B compares an arrangement where the field plate interconnection 35b passes over the gate finger 33b with another arrangement where the field plate interconnection 35e passes under the gate finger 33b. As shown in FIG. 26A, when the field plate interconnection 35b passes over the gate finger 33b, an area of the gate finger 33b facing the field plate interconnection 35b increases depending on a cross section of the gate finger 33b, exactly depending on a height of the gate finger 33b, which increases parasitic capacitance between the gate electrode 33 and the source electrode 32, namely, $C_{gs}$. Also, the field plate interconnection 35b possibly causes a failure of breakage at edges of the gate finger 33b. On the other hand, as shown in FIG. 26B, in an arrangement where the field plate interconnection 35e passes under the gate finger 33b, the parasitic capacitance $C_{gs}$ is substantially invariant and the possibility to cause the breakage at the edge of the gate finger 33b may be ignorable.

Also, the field plate interconnection 35e passing under the gate finger 33b is preferably formed thin, which makes the formation of the gate finger 33b above the field plate interconnection 35e easy enough.

This written description above presented provides examples to describe the invention and to enable a person of ordinary skill in the art to make and use the invention. However, the written description above does not limit the invention to the embodiments and modifications thereof. For instance, the description above concentrates on a transistor type of high electrode mobility transistor (HEMT) primarily formed by gallium nitride (GaN) and other semiconductor materials categorized within GaN; however, the invention becomes applicable to transistors with other types but having a field plate. Also, the embodiment and the modifications thereof provides the inactive regions, B11 and B12, formed by implanting heavy ions within a semiconductor stack including the channel layer; but the inactive region B1 may be formed by etching the semiconductor stack to leave a mesa including the channel layer and the barrier layer.

Accordingly, the embodiments and the modifications are to be considered as illustrative not restrictive.

What is claimed is:

1. A transistor type of field effect transistor having a drain electrode, a source electrode, and a gate electrode, comprising:
    a semiconductor stack having an active region and inactive regions sandwiching the active region therebetween, the active region providing the drain electrode, the source electrode, and the gate electrode therein;
    a drain interconnection including a drain bus and a drain finger, the drain bus being disposed in one of the inactive regions, the drain finger extending substantially parallel to the gate electrode and overlapping with the drain electrode;
    a source interconnection including a source bus and a source finger, the source bus being disposed in another of the inactive regions, the source finger extending substantially parallel to the gate electrode and overlapping with the source electrode; and
    a field plate including a field plate finger and a field plate interconnection, the field plate finger extending substantially parallel to the gate electrode in an area between the gate electrode and the drain electrode, the field plate finger partially overlapping with the gate electrode,
    wherein the field plate interconnection is provided in the another of the inactive regions and connects the field plate finger with the source interconnection.

2. The transistor according to claim 1,
    wherein the field plate interconnection passes over the gate electrode in the another of the inactive regions.

3. The transistor according to claim 1,
    wherein the field plate interconnection passes under the gate electrode in the another of the inactive regions.

4. The transistor according to claim 3,
    wherein the field plate finger is connected with the field plate interconnection through a via.

5. The transistor according to claim 1,
    wherein the field plate interconnection extends perpendicular to the gate electrode and the source electrode.

6. The transistor according to claim 1,
    wherein the field plate interconnection connects the field plate finger with the source finger.

7. The transistor according to claim 1,
    wherein the field plate interconnection connects the field plate finger with the source bus.

8. The transistor according to claim 7,
    wherein the field plate interconnection further connects the field plate finger with the source finger.

* * * * *